US009832094B2

(12) United States Patent
Wiley

(10) Patent No.: US 9,832,094 B2
(45) Date of Patent: Nov. 28, 2017

(54) MULTI-WIRE ELECTRICAL PARAMETER MEASUREMENTS VIA TEST PATTERNS

(71) Applicant: QUALCOMM Incorporated, San Diego, CA (US)

(72) Inventor: George Alan Wiley, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 329 days.

(21) Appl. No.: 14/666,018

(22) Filed: Mar. 23, 2015

(65) Prior Publication Data

US 2015/0271037 A1   Sep. 24, 2015

Related U.S. Application Data

(60) Provisional application No. 61/969,512, filed on Mar. 24, 2014.

(51) Int. Cl.

| | | |
|---|---|---|
| G01R 33/14 | (2006.01) | |
| H04L 12/26 | (2006.01) | |
| G01R 31/319 | (2006.01) | |
| G01R 31/317 | (2006.01) | |
| H04B 1/10 | (2006.01) | |
| H04B 3/46 | (2015.01) | |
| H04L 25/02 | (2006.01) | |

(Continued)

(52) U.S. Cl.
CPC ...... *H04L 43/087* (2013.01); *G01R 31/31708* (2013.01); *G01R 31/31901* (2013.01); *H04B 1/1081* (2013.01); *H04B 3/46* (2013.01); *H04B 3/462* (2013.01); *H04L 25/0272* (2013.01); *H04L 25/14* (2013.01); *G06K 2207/00* (2013.01); *G06N 3/00* (2013.01); *G06T 2200/00* (2013.01); *H04L 25/4923* (2013.01)

(58) Field of Classification Search
CPC ......... C12Q 1/00; C12Q 2304/00; G06F 1/00; G06F 2101/00; G06K 1/00; G06K 2207/00; G06N 3/00; G06T 1/00; G06T 2200/00
See application file for complete search history.

(56) References Cited

U.S. PATENT DOCUMENTS 5,267,269 A * 11/1993 Shih .................. H04L 25/03866
178/69 N
6,937,949 B1 * 8/2005 Fishman .......... G01R 31/31709
375/226

(Continued)

FOREIGN PATENT DOCUMENTS

WO   WO-2013138478 A1   9/2013

OTHER PUBLICATIONS

International Search Report and Written Opinion—PCT/US2015/022249—ISAEPO—dated Jun. 23, 2015.

*Primary Examiner* — Jermele M Hollington
*Assistant Examiner* — Temilade Rhodes-Vivour
(74) *Attorney, Agent, or Firm* — Loza & Loza LLP

(57) ABSTRACT

A measurement task is selected, where the measurement task is associated with a transmission of an encoded signal transmitted via a plurality of data lines. The encoded signal is encoded using one or more of 3-Phase, N-Phase, or N-factorial low-voltage differential signaling (LVDS) where N is at least three (3). A repeating waveform is generated corresponding to the measurement task. The repeating waveform corresponding to the measurement task is then transmitted via the plurality of data lines.

26 Claims, 42 Drawing Sheets

(51) Int. Cl.
    *H04L 25/14*   (2006.01)
    *H04B 3/462*   (2015.01)
    *G06N 3/00*    (2006.01)
    *H04L 25/49*   (2006.01)

(56)          References Cited

U.S. PATENT DOCUMENTS

| | | |
|---|---|---|
| 8,423,315 B2 | 4/2013 | Kappauf et al. |
| 8,861,578 B1 | 10/2014 | Lusted et al. |
| 9,112,815 B2* | 8/2015 | Wiley .................... H04L 47/745 |
| 2008/0212709 A1* | 9/2008 | Wiley ....................... H04L 5/20 |
| | | 375/286 |
| 2008/0247451 A1 | 10/2008 | Yamaguchi |
| 2010/0029320 A1* | 2/2010 | Malladi ............... H04L 27/2614 |
| | | 455/522 |
| 2010/0080274 A1 | 4/2010 | Ishida et al. |
| 2011/0169480 A1 | 7/2011 | Ho et al. |
| 2012/0013361 A1 | 1/2012 | Ware |
| 2013/0308718 A1* | 11/2013 | Hansen ............... H04L 25/0228 |
| | | 375/295 |
| 2014/0169429 A1 | 6/2014 | Ran |
| 2014/0334583 A1 | 11/2014 | Lee |
| 2015/0003505 A1* | 1/2015 | Lusted ................ H04L 25/4917 |
| | | 375/224 |

\* cited by examiner

FIG. 19

| Sym # | prev | \multicolumn{14}{c}{14-Symbol Test Pattern} | | | | | | | | | | | | | |
|---|---|---|---|---|---|---|---|---|---|---|---|---|---|---|---|
| | | s0 | s1 | s2 | s3 | s4 | s5 | s6 | s7 | s8 | s9 | s10 | s11 | s12 | s13 |
| Symbol Pattern | ... | 4 | 4 | 2 | 2 | 4 | 4 | 2 | 2 | 4 | 4 | 3 | 1 | 1 | 0 |
| Cycle 1 | +x | -x | +x | +y | +z | -z | +z | +x | +y | -y | +y | -z | +y | -x | -z |
| Cycle 2 | -z | +z | -z | -x | -y | +y | -y | -z | -x | +x | -x | +y | -x | +z | +y |
| Cycle 3 | +y | -y | +y | +z | +x | -x | +x | +y | +z | -z | +z | -x | +z | -y | -x |
| Cycle 4 | -x | +x | -x | -y | -z | +z | -z | -x | -y | +y | -y | +z | -y | +x | +z |
| Cycle 5 | +z | -z | +z | +x | +y | -y | +y | +z | -x | -x | +x | -y | +x | -z | -y |
| Cycle 6 | -y | +y | -y | -z | -x | +x | -x | -y | -z | +z | -z | +x | -z | +y | +x |

| Sym # | prev | \multicolumn{14}{c}{14-Symbol Test Pattern} | | | | | | | | | | | | | |
|---|---|---|---|---|---|---|---|---|---|---|---|---|---|---|---|
| | | s0 | s1 | s2 | s3 | s4 | s5 | s6 | s7 | s8 | s9 | s10 | s11 | s12 | s13 |
| Symbol Pattern | ... | 4 | 2 | 2 | 2 | 0 | 0 | 0 | 2 | 3 | 3 | 3 | 1 | 1 | 1 |
| Cycle 1 | +x | -x | -y | -z | -x | -z | -y | -x | -y | +z | -x | +y | -x | +z | -y |
| Cycle 2 | -y | +y | +z | +x | +y | +x | +z | +y | +z | -x | +y | -z | +y | -x | +z |
| Cycle 3 | +z | -z | -x | -y | -z | -y | -x | -z | -x | +y | -z | +x | -z | +y | -x |
| Cycle 4 | -x | +x | +y | +z | +x | +z | +y | +x | +y | -z | +x | -y | +x | -z | +y |
| Cycle 5 | +y | -y | -z | -x | -y | -x | -z | -y | -z | +x | -y | +z | -y | +x | -z |
| Cycle 6 | -z | +z | +x | +y | +z | +y | +x | +z | +x | -y | +z | -x | +z | -y | +x |

*FIG. 26*

MULTI-WIRE ELECTRICAL PARAMETER MEASUREMENTS VIA TEST PATTERNS

CROSS-REFERENCE TO RELATED APPLICATIONS

The present application for patent claims priority to Provisional Application No. App. No. 61/969,512, entitled "Multi-Wire Electrical Parameter Measurement Via Test Patterns" filed Mar. 24, 2014, which is assigned to the assignee hereof and hereby expressly incorporated by reference herein.

FIELD

The present disclosure relates generally to physical layer electrical testing, and more particularly, to reliably measuring electrical parameters in multi-wire differential signaling systems.

BACKGROUND

In multi-signal data transfer, for example, multi-wire differential signaling such as 3-Phase, N-Phase, or N-factorial low-voltage differential signaling (LVDS), it can be challenging to measure particular electrical parameters including, for example, individual wire state signal levels during normal operation, as well as the strongest one and zero levels while transmitting pseudo-random data. To this end, it should be noted that the wire state transition region includes inherent "jitter" due to the different transition times through the zero-crossing levels, which are particularly prevalent in 3-Phase and N-Phase systems. Because the inherent jitter caused by multiple zero-crossing transitions of a 3-Phase/N-Phase signal is often larger than the jitter of the internal symbol rate clock, it is difficult to measure the jitter of the internal transmit symbol rate clock. Measuring rise and fall times of a waveform is also challenging because of the many different types of signal transitions to and from different levels.

Accordingly, it would be desirable to provide a mechanism to facilitate more reliable testing of electrical parameters in multi-wire differential signaling systems. To this end, it should be noted that the above-described deficiencies are merely intended to provide an overview of some of the problems of conventional systems, and are not intended to be exhaustive. Other problems with the state of the art and corresponding benefits of some of the various non-limiting embodiments may become further apparent upon review of the following detailed description.

SUMMARY

A transmitter device is provided for generating test patterns. A selection circuit may be configured to select a measurement task associated with a transmission of an encoded signal transmitted via a plurality of data lines. The encoded signal is encoded using one or more of 3-Phase, N-Phase, or N-factorial low-voltage differential signaling (LVDS) where N is at least three (3). A generator circuit may be configured to generate a repeating waveform corresponding to the measurement task. A transmitter circuit may be configured to transmit the repeating waveform corresponding to the measurement task via the plurality of data lines.

In one instance, the measurement task may be a transmit clock jitter measurement, and generating the repeating waveform includes repeating a periodic waveform on a single wire pair of the plurality of data lines.

In a second instance, the measurement task may be a transmit clock jitter measurement, and generating the repeating waveform includes repeating a periodic waveform on a plurality of wire pairs of the plurality of data lines.

In a third instance, the measurement task may be a signal level measurement, and generating the repeating waveform includes repeating a staircase waveform on each of the plurality of data lines.

In a fourth instance, the measurement task may be a rise and fall time measurement, and generating the repeating waveform includes repeating a waveform that causes all possible state transitions associated with the plurality of lines to occur.

In one example, generating the repeating waveform may include generating any of a plurality of repeating waveforms via a programmable pattern generator, each of the plurality of repeating waveforms respectively associated with a corresponding measurement task.

Additionally, an encoder may serve to encode the signals and the repeating waveform is generated to have a pattern that beats with a state of the encoder to produce a longer repeating pattern of states on the plurality of data lines than would be produced without such beating.

In a second example, the repeating waveform may be generated to have a pattern that traces all possible state transitions of the encoded signal. The encoded signal may have thirty possible state transitions and the repeating waveform of fourteen symbols is generated to have a pattern that traces all thirty possible state transitions.

In a third example, the repeating waveform may be generated to have a staircase pattern.

In a fourth example, the repeating waveform may be generated to have a pattern that limits a number of zero-voltage crossings of signals on the data lines.

In a fifth example, the repeating waveform may be generated to have a pattern that limits zero-voltage crossings of signals on the data lines to transitions between a pair of data lines of the plurality of data lines.

A receiver device is also provided for measuring a task based on test patterns. A receiving circuit may be configured to receive a signal via a plurality of data lines, the signal corresponding to a measurement task associated with an encoded signal. The signal may comprise a repeating waveform on at least one of the plurality of data lines, wherein the encoded signal uses one or more of 3-Phase, N-Phase, or N-factorial low-voltage differential signaling (LVDS) where N is at least three (3). A differential circuit may be configured to ascertain at least one differential from the signal, the at least one differential corresponding to a differential between a pair of the plurality of data lines. A measurement circuit may be configured to determine a measurement associated with the measurement task, the measurement based on the at least one differential.

In one instance, the measurement task may be a transmit clock jitter measurement, and receiving the signal includes receiving a repeating periodic waveform on a single wire pair of the plurality of data lines.

In a second instance, the measurement task may be a transmit clock jitter measurement, and receiving the signal includes receiving a repeating periodic waveform on a plurality of wire pairs of the plurality of data lines.

In a third instance, the measurement task may be a signal level measurement, and receiving the signal includes receiving a repeating staircase waveform on each of the plurality of data lines.

In a fourth instance, the measurement task may be a rise and fall time measurement, and receiving the signal includes receiving a repeating waveform in which all possible state transitions associated with the plurality of lines occur.

The repeating waveform may have a pattern that traces all possible state transitions of the encoded signal.

The encoded signal may have thirty possible state transitions and the repeating waveform of fourteen symbols has a pattern that traces all thirty possible state transitions.

In one example, the repeating waveform has a staircase pattern.

In second example, the repeating waveform has a pattern that limits a number of zero-voltage crossings of signals on the data lines. The repeating waveform may have a pattern that limits zero-voltage crossings of signals on the data lines to transitions between a pair of data lines of the plurality of data lines.

DRAWINGS

Various features, nature, and advantages may become apparent from the detailed description set forth below when taken in conjunction with the drawings in which like reference characters identify correspondingly throughout.

Figure 9A:
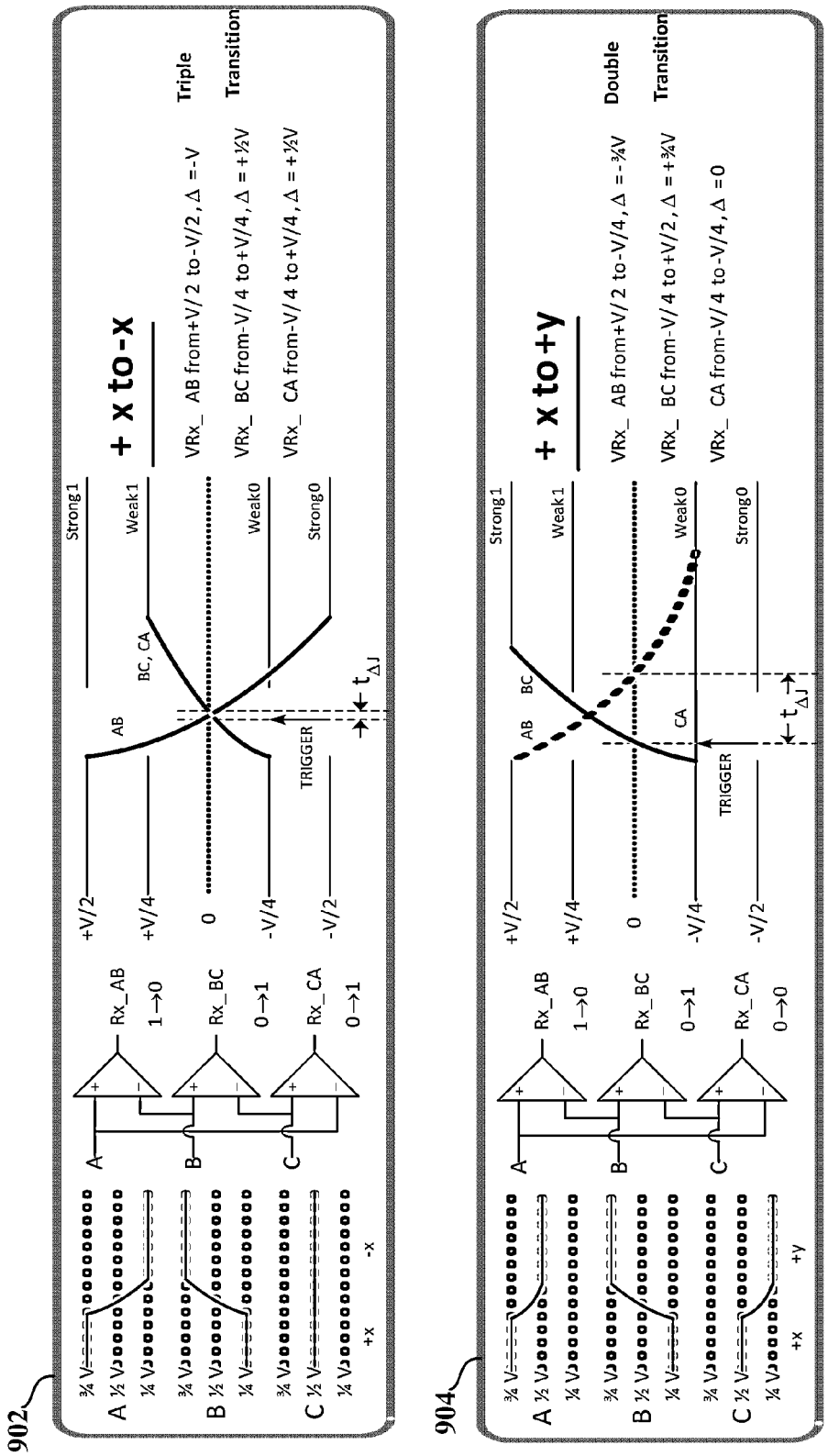
Figure 9B:
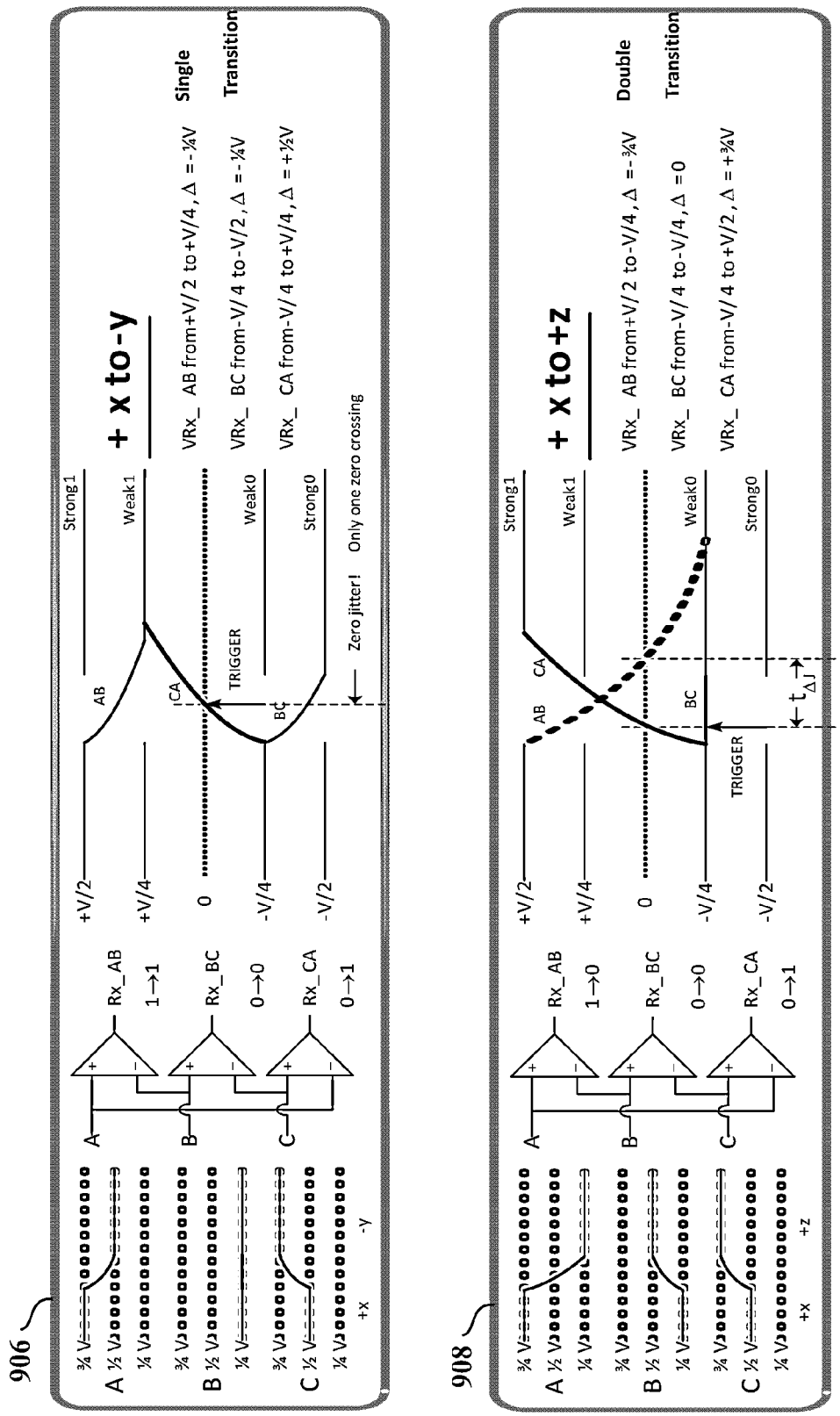
Figure 9C:
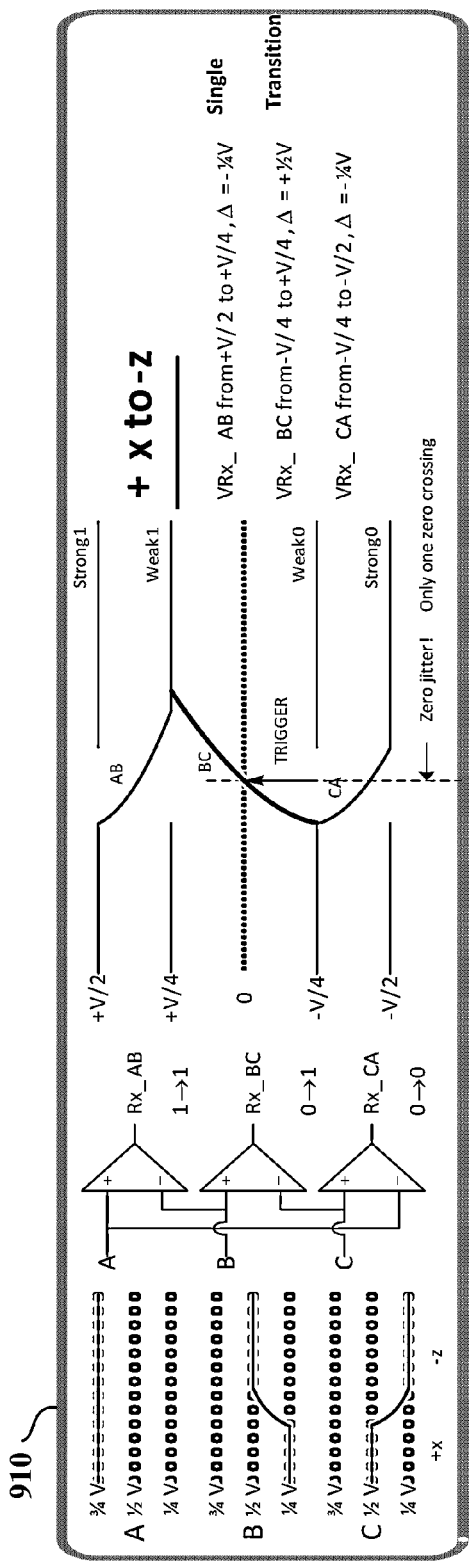

FIG. 9 (comprising FIGS. 9A, 9B, and 9C) illustrates possible state transitions from a +x state for a 3-Phase signal.

Figure 10:
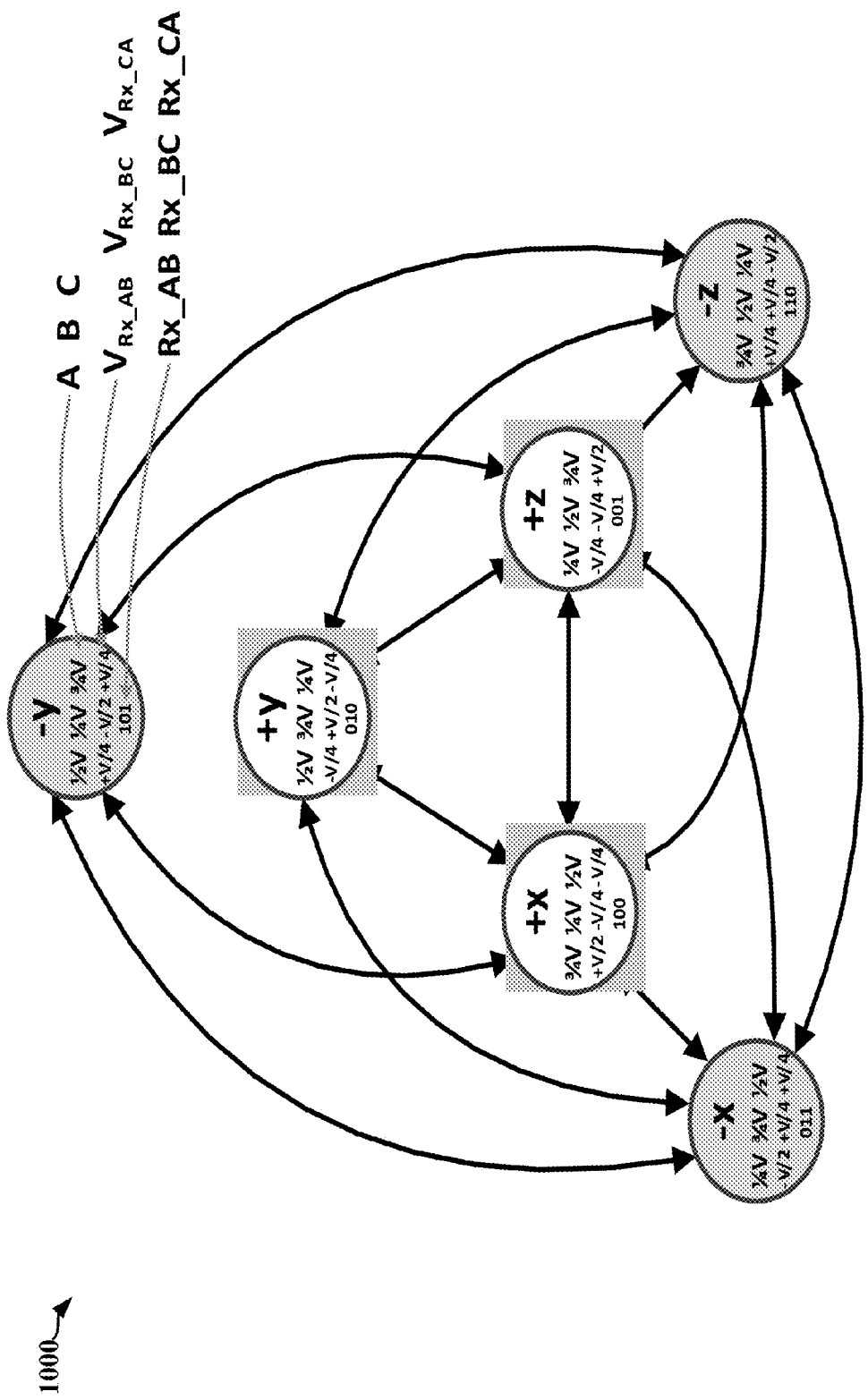

FIG. 10 is a state diagram illustrating exemplary 3-Phase state transitions.

Figure 11:
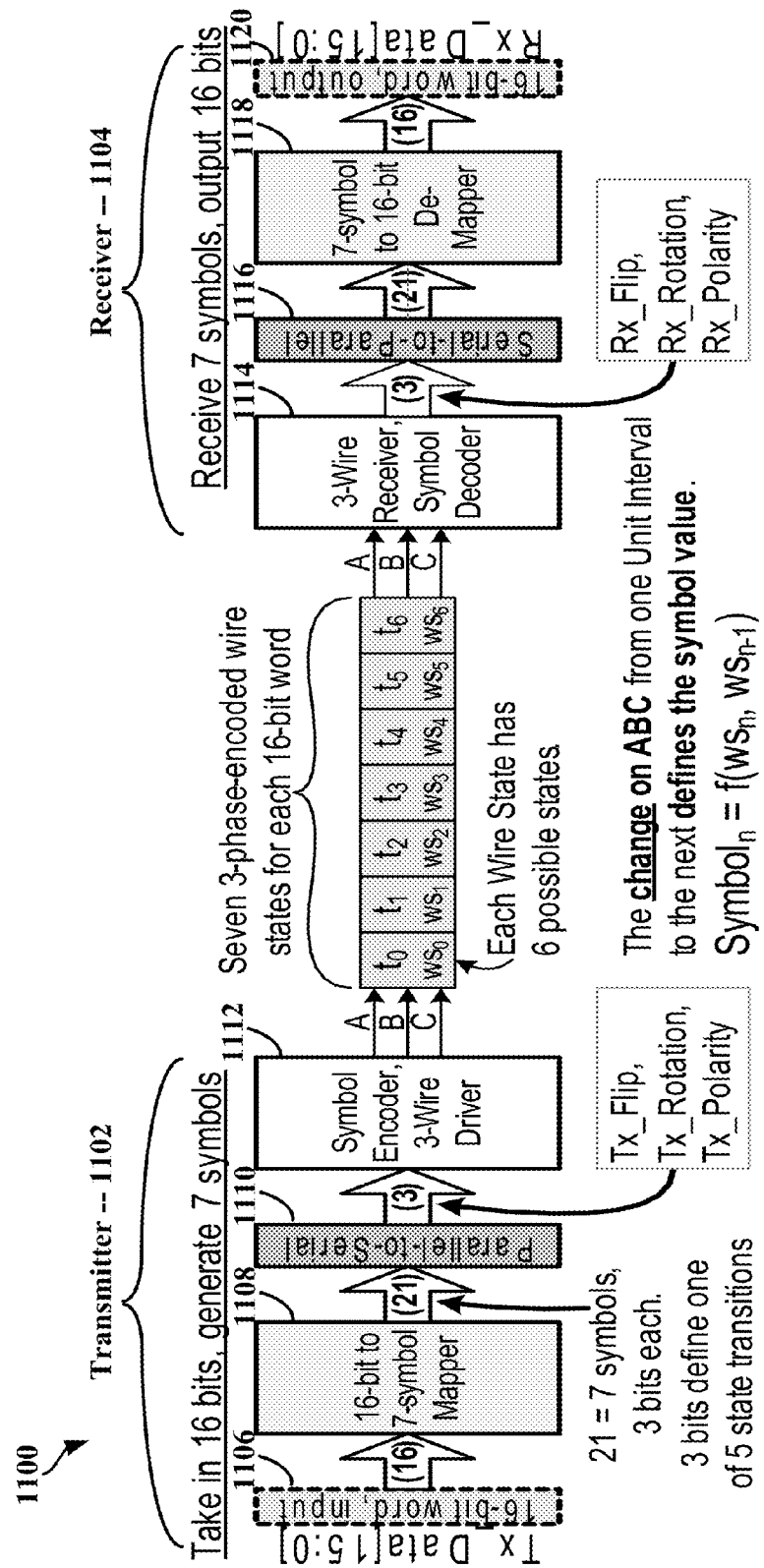

FIG. 11 illustrates an exemplary end-to-end transmission of data comprising a 16-bit word conversion to channel states.

Figure 12:
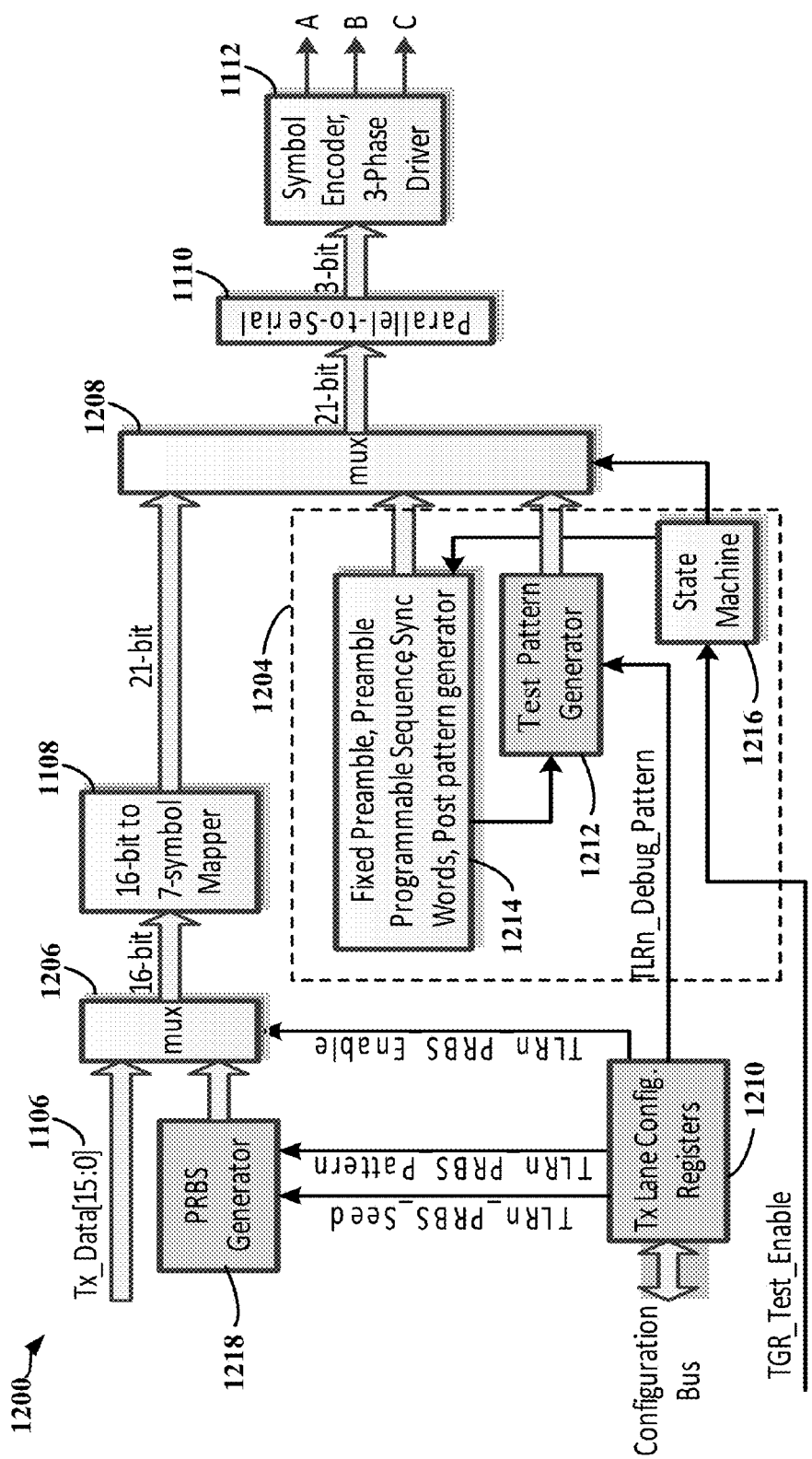

FIG. 12 illustrates an exemplary single lane transmitter with test circuitry in accordance with an aspect of the disclosure.

Figure 13:
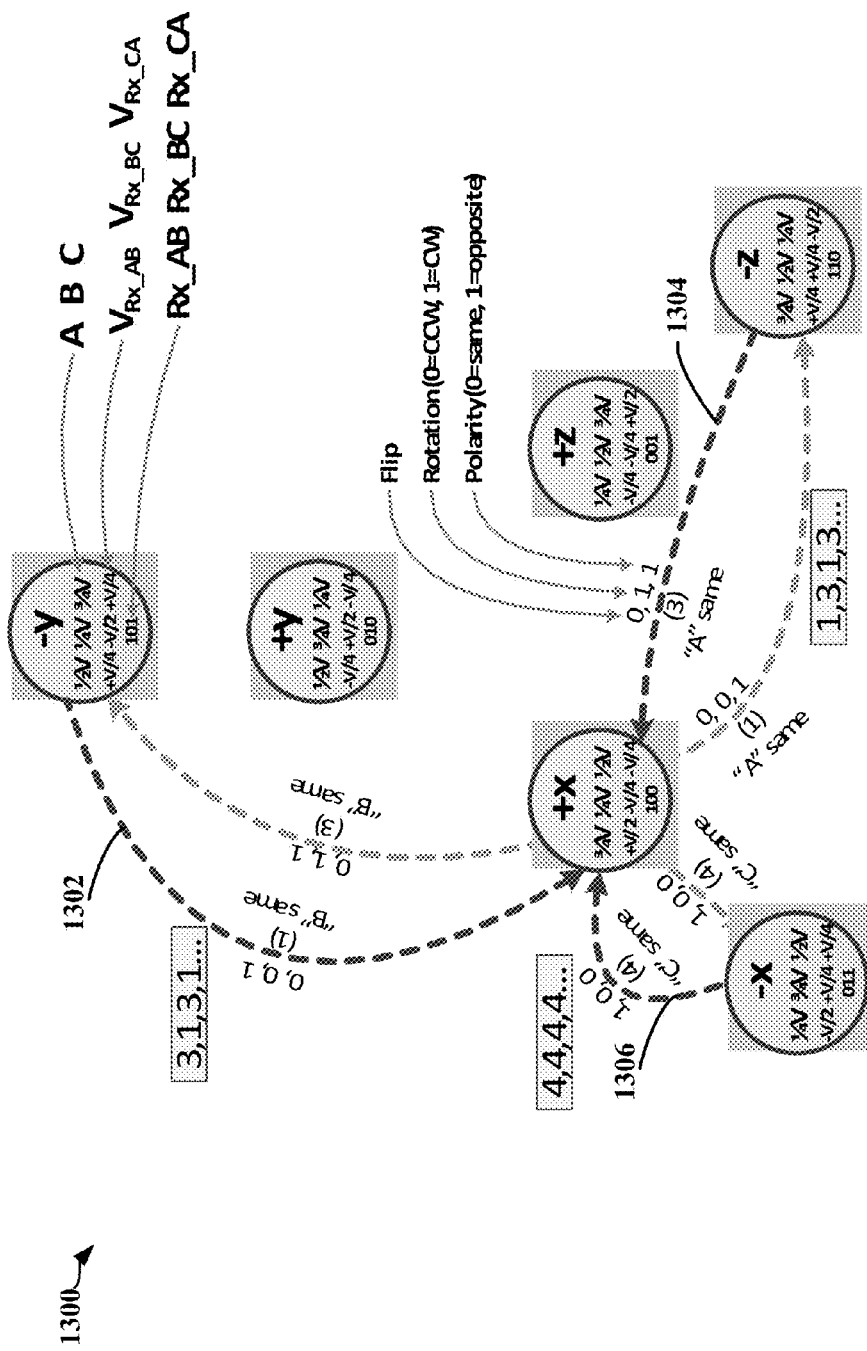

FIG. 13 illustrates exemplary symbol patterns that create state transition loops in accordance with an aspect of the disclosure.

Figure 14:
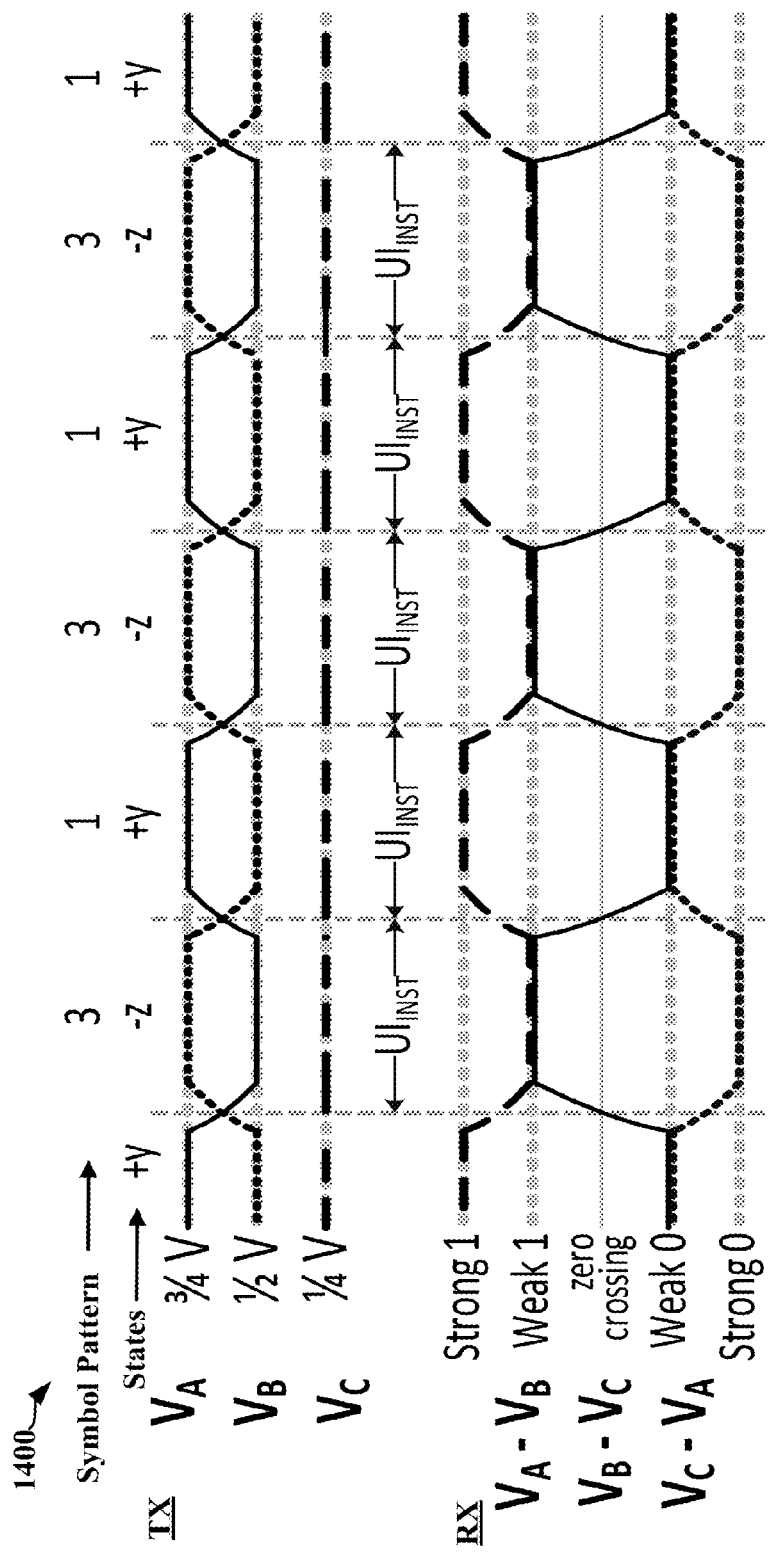

FIG. 14 illustrates a first exemplary time domain waveform that facilitates transmit clock jitter measurements in accordance with an aspect of the disclosure.

Figure 15:
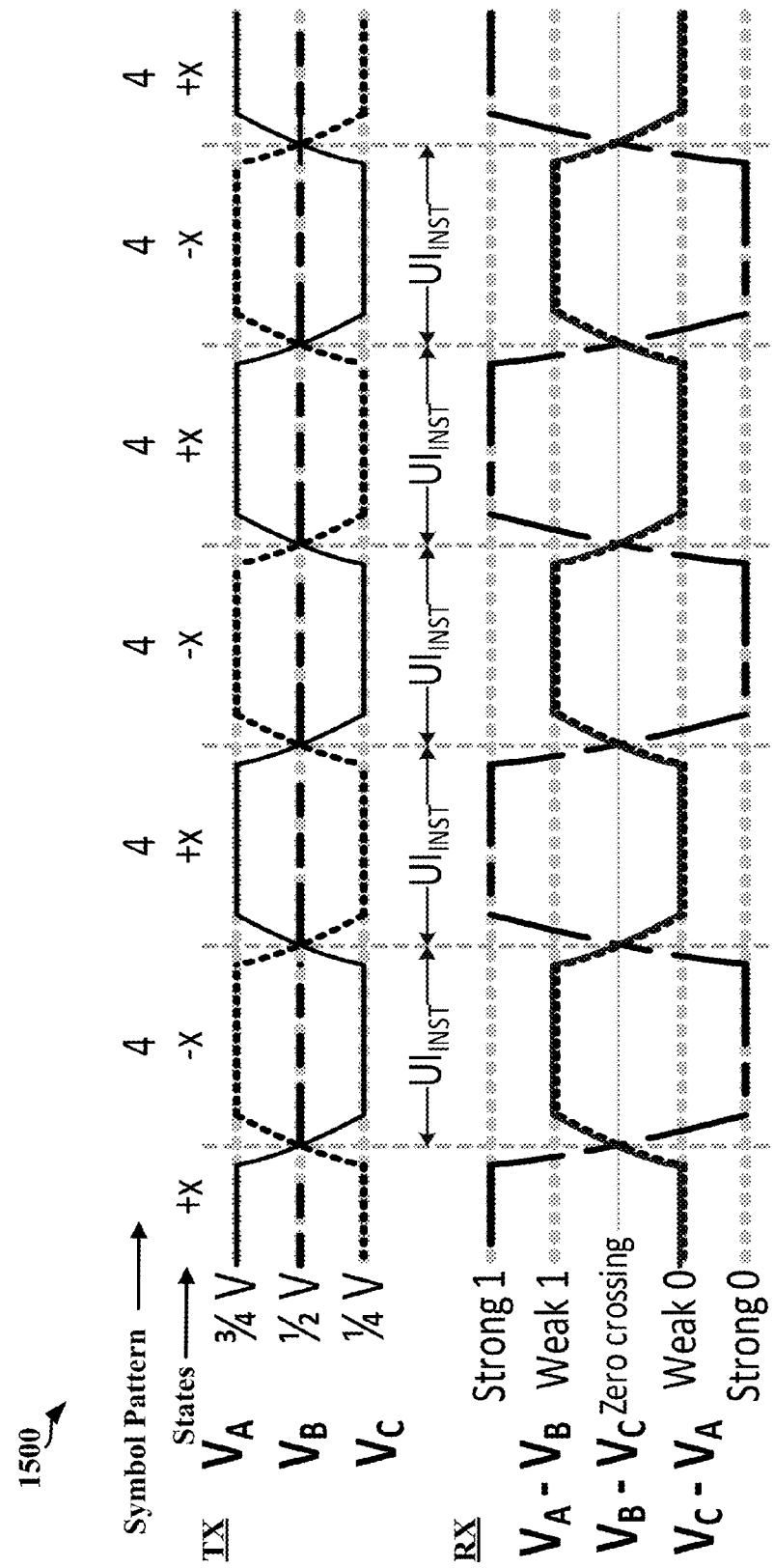

FIG. 15 illustrates a second exemplary time domain waveform that facilitates transmit clock jitter measurements in accordance with an aspect of the disclosure.

Figure 16:
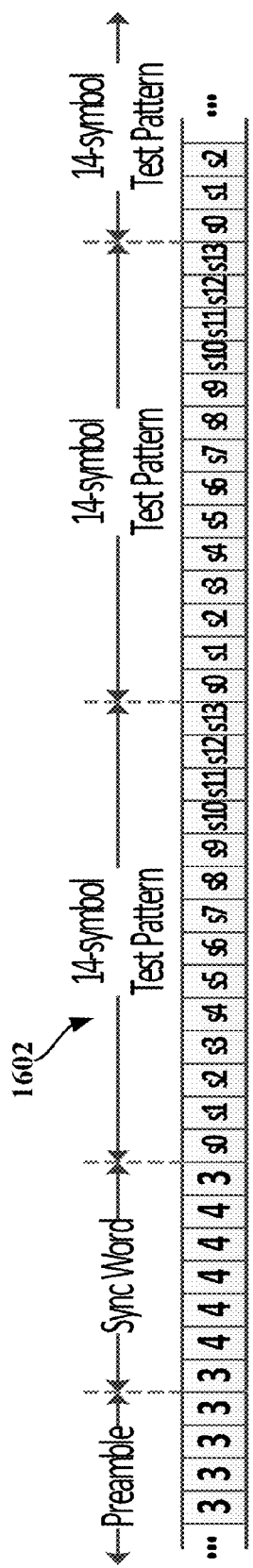

FIG. 16 illustrates an exemplary repeating 14-symbol test pattern in accordance with an aspect of the disclosure.

Figure 17:
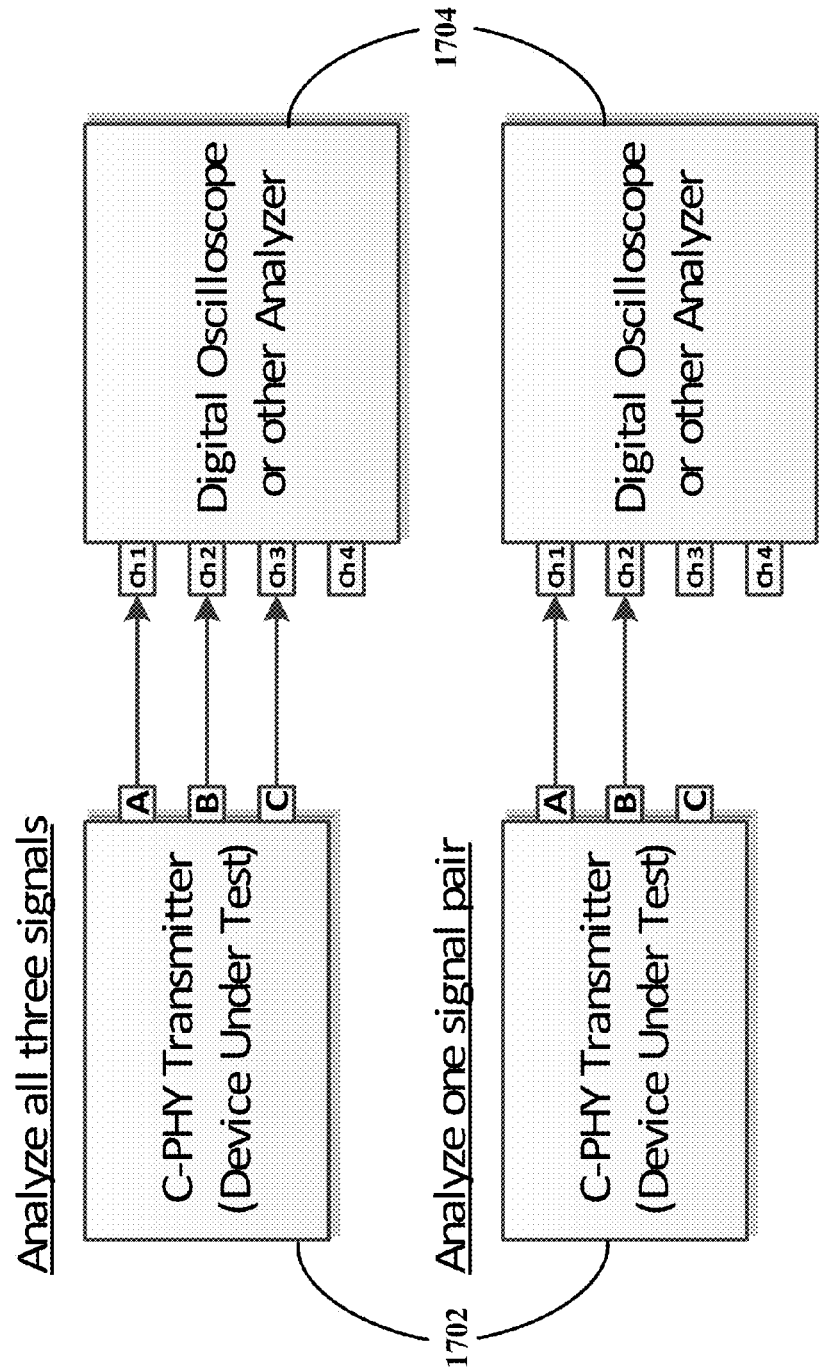

FIG. 17 is a block diagram illustrating an exemplary coupling of testing equipment to a transmitter device that facilitates signal quality measurements in accordance with an aspect of the disclosure.

Figure 18:
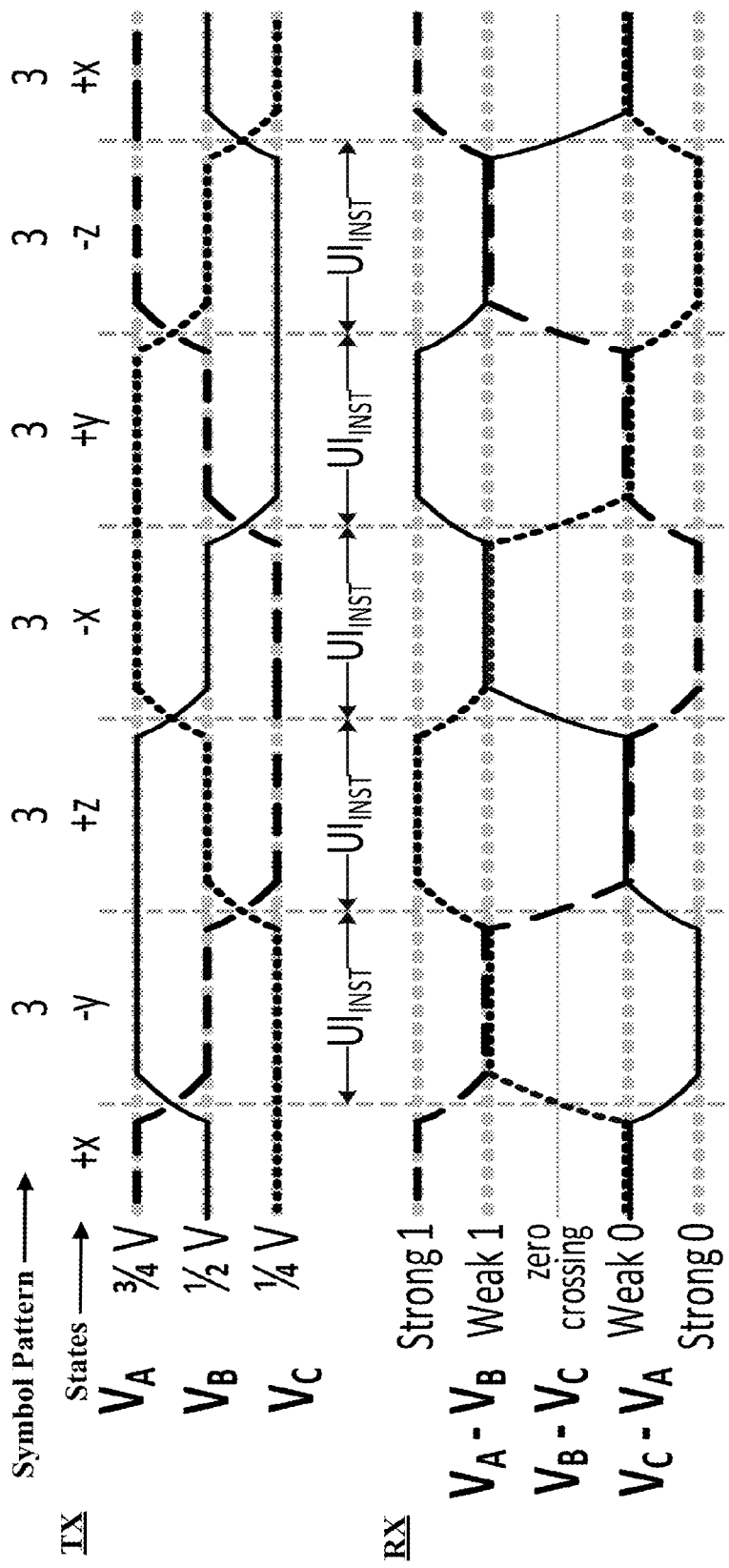

FIG. 18 illustrates an exemplary staircase waveform that facilitates signal level measurements in accordance with an aspect of the disclosure.

FIG. 19 illustrates a first exemplary 14-symbol sequence that facilitates rise and fall time measurements in accordance with an aspect of the disclosure.

Figure 20:
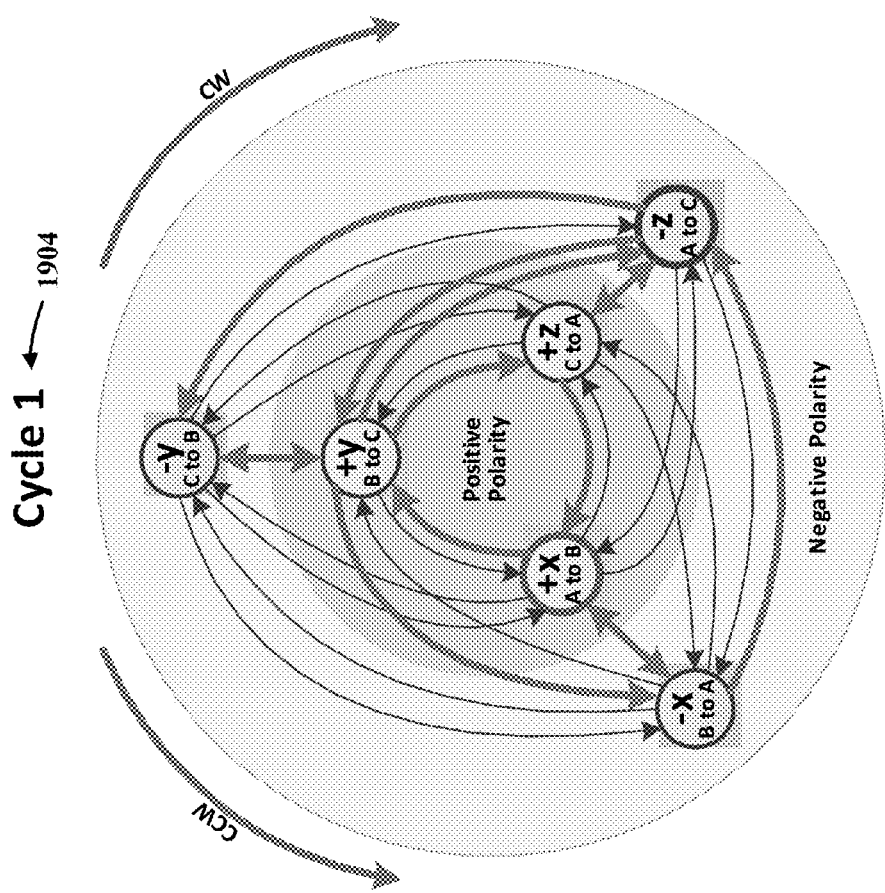

FIG. 20 illustrates a first cycle of wire state transitions for the exemplary test pattern provided in FIG. 19.

Figure 21:
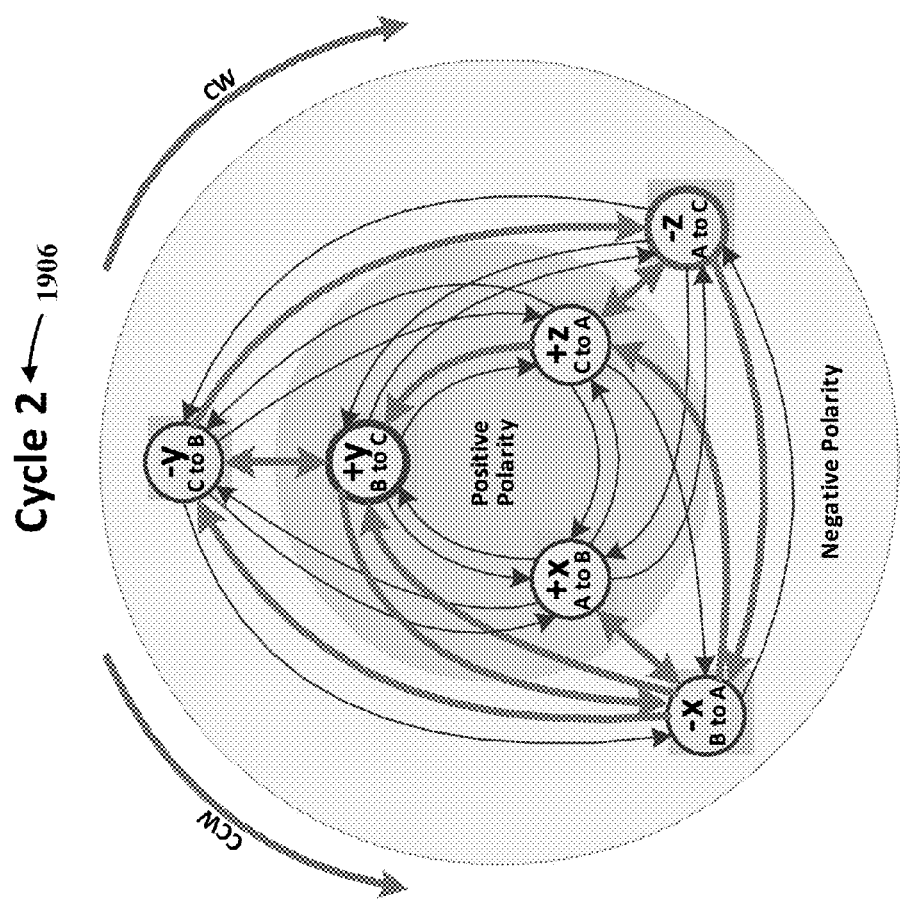

FIG. 21 illustrates a second cycle of wire state transitions for the exemplary test pattern provided in FIG. 19.

Figure 22:
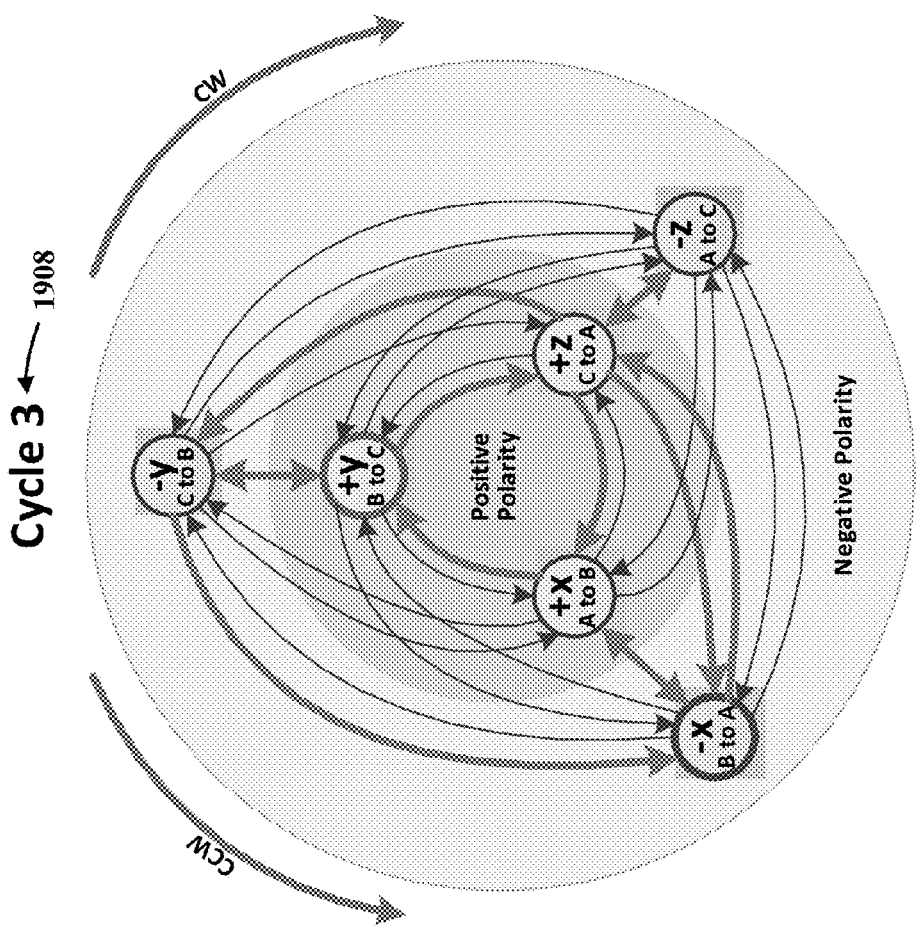

FIG. 22 illustrates a third cycle of wire state transitions for the exemplary test pattern provided in FIG. 19.

Figure 23:
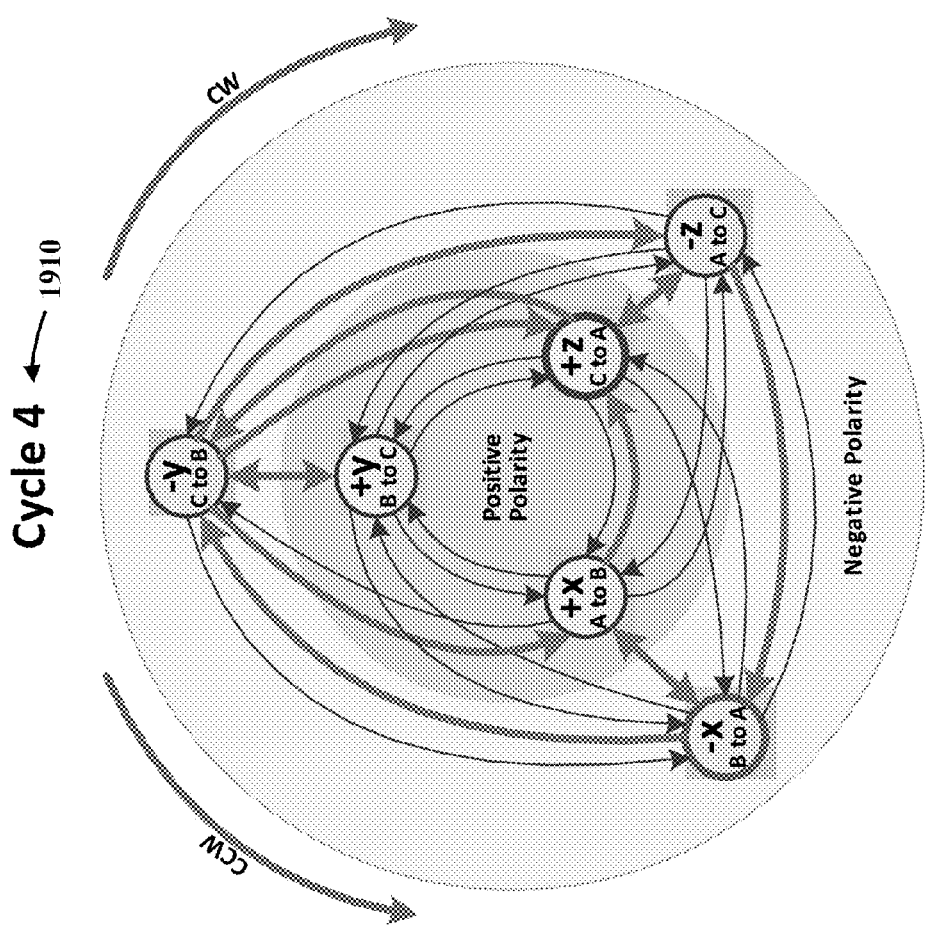

FIG. 23 illustrates a fourth cycle of wire state transitions for the exemplary test pattern provided in FIG. 19.

Figure 24:
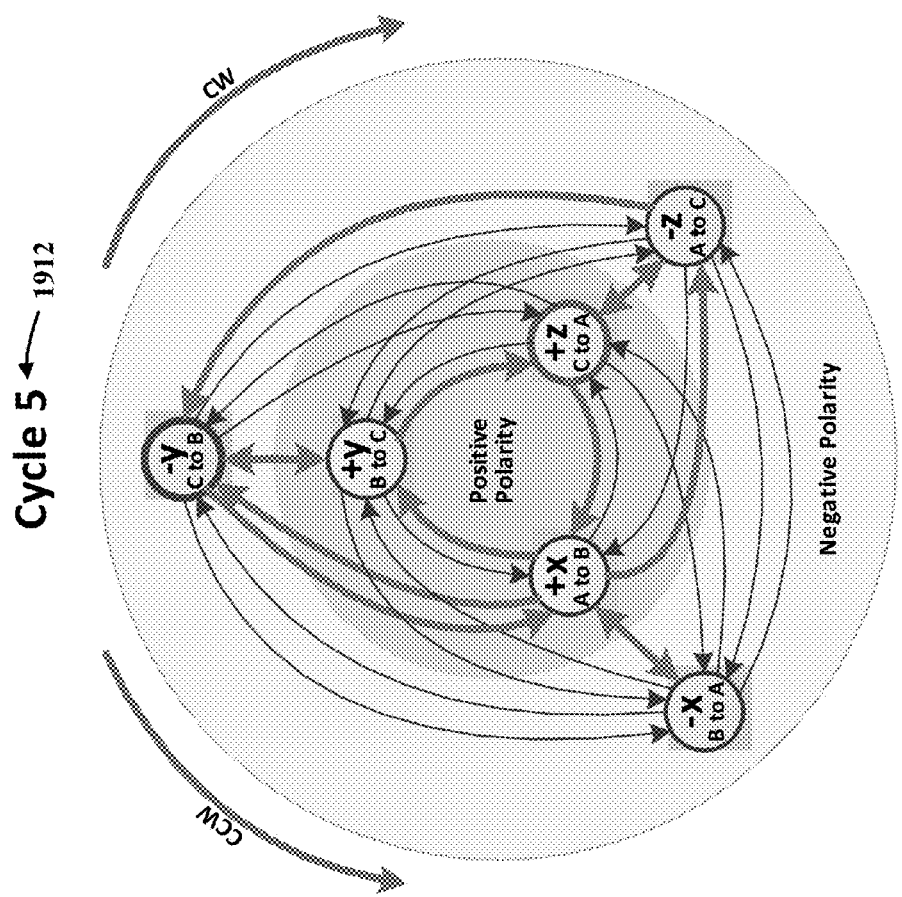

FIG. 24 illustrates a fifth cycle of wire state transitions for the exemplary test pattern provided in FIG. 19.

Figure 25:
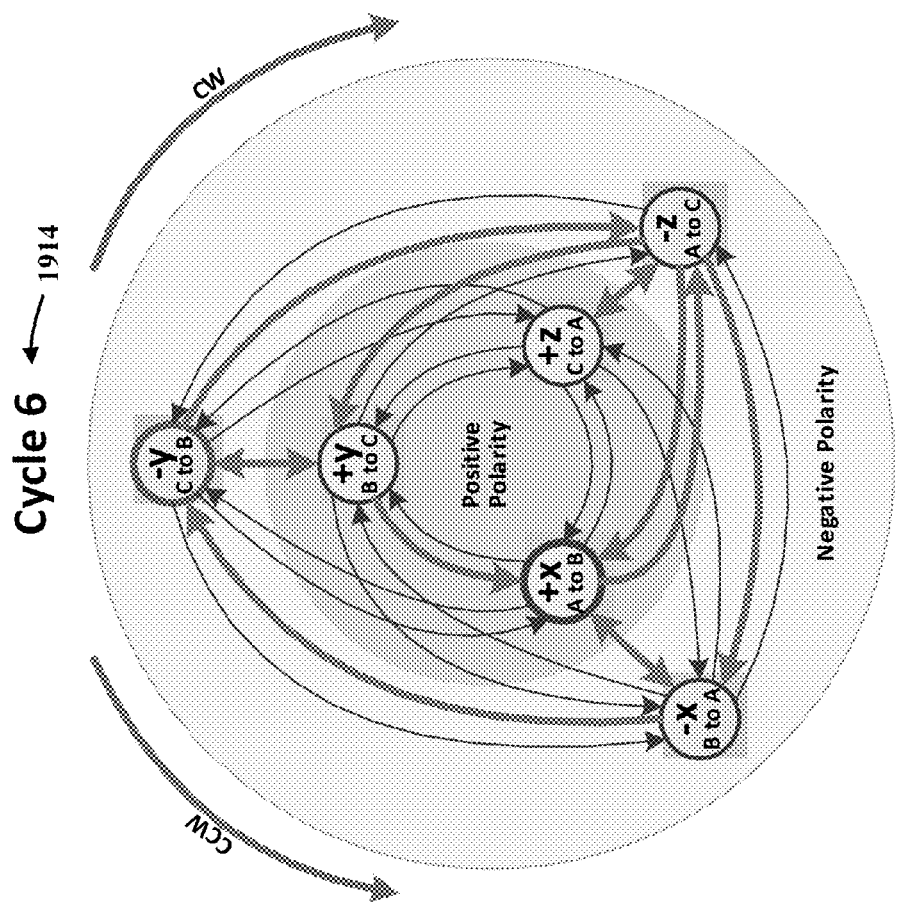

FIG. 25 illustrates a sixth cycle of wire state transitions for the exemplary test pattern provided in FIG. 19.

FIG. 26 illustrates a second exemplary 14-symbol sequence that facilitates rise and fall time measurements in accordance with an aspect of the disclosure.

Figure 27:
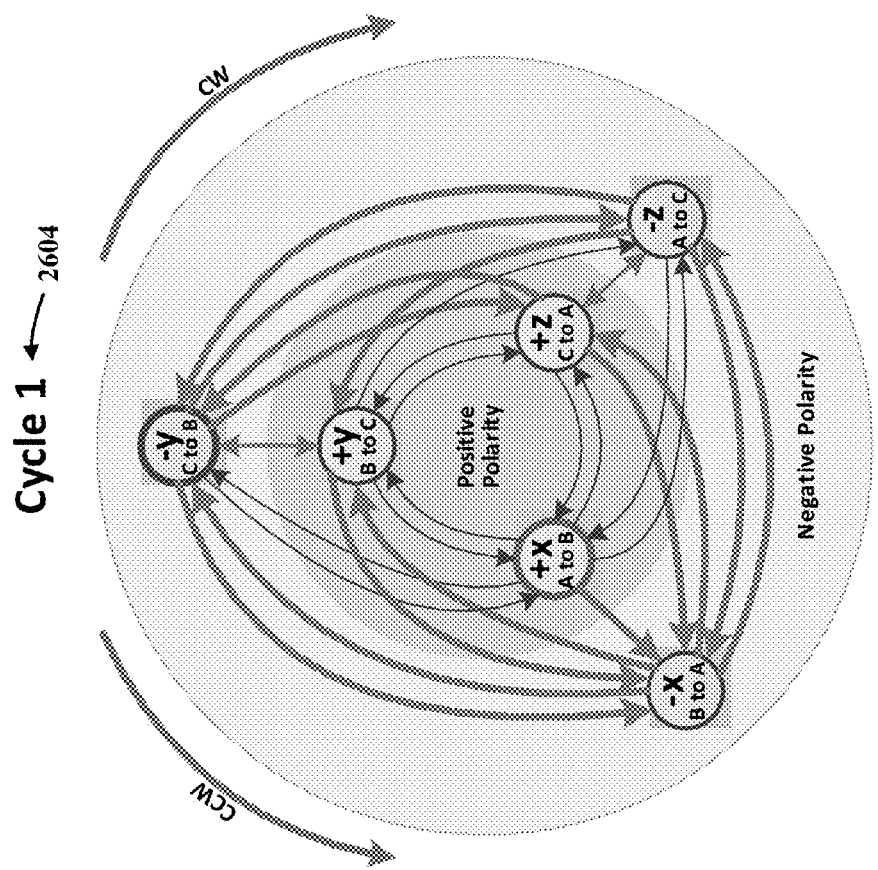

FIG. 27 illustrates a first cycle of wire state transitions for the exemplary test pattern provided in FIG. 26.

Figure 28:
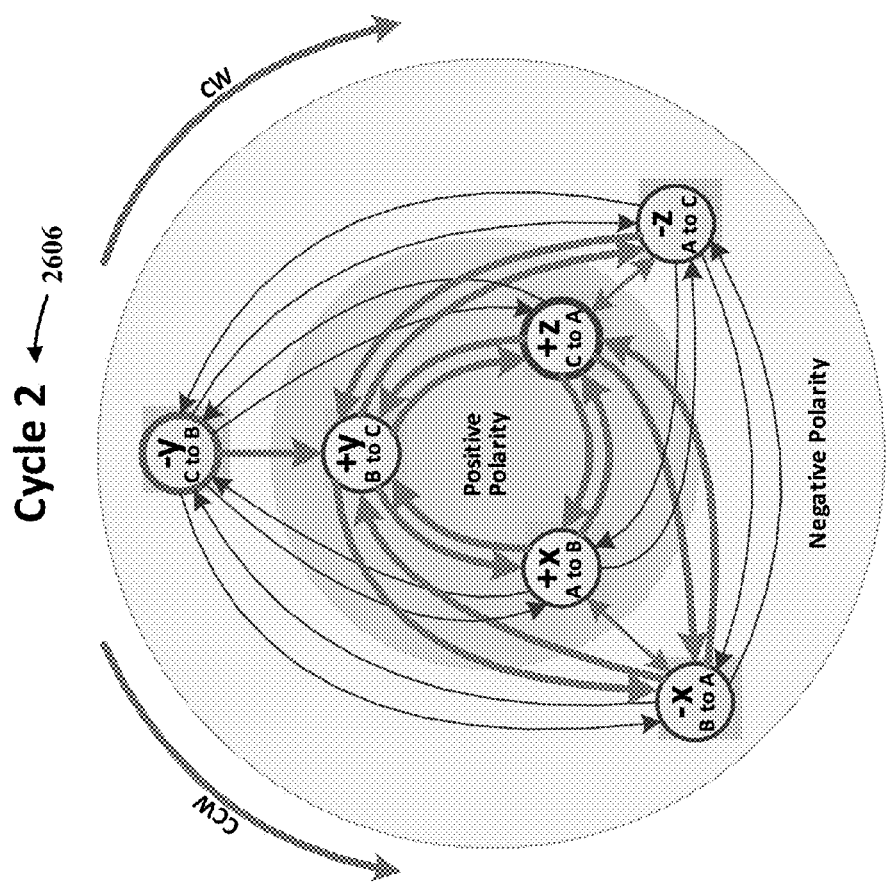

FIG. 28 illustrates a second cycle of wire state transitions for the exemplary test pattern provided in FIG. 26.

Figure 29:
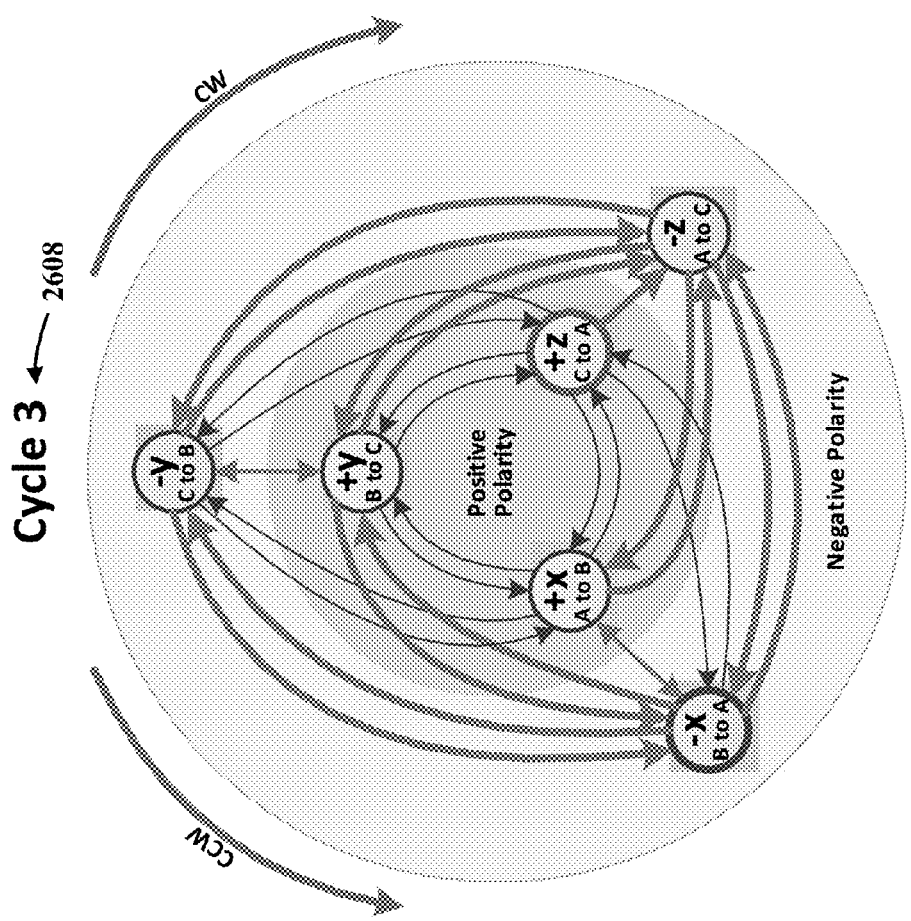

FIG. 29 illustrates a third cycle of wire state transitions for the exemplary test pattern provided in FIG. 26.

Figure 30:
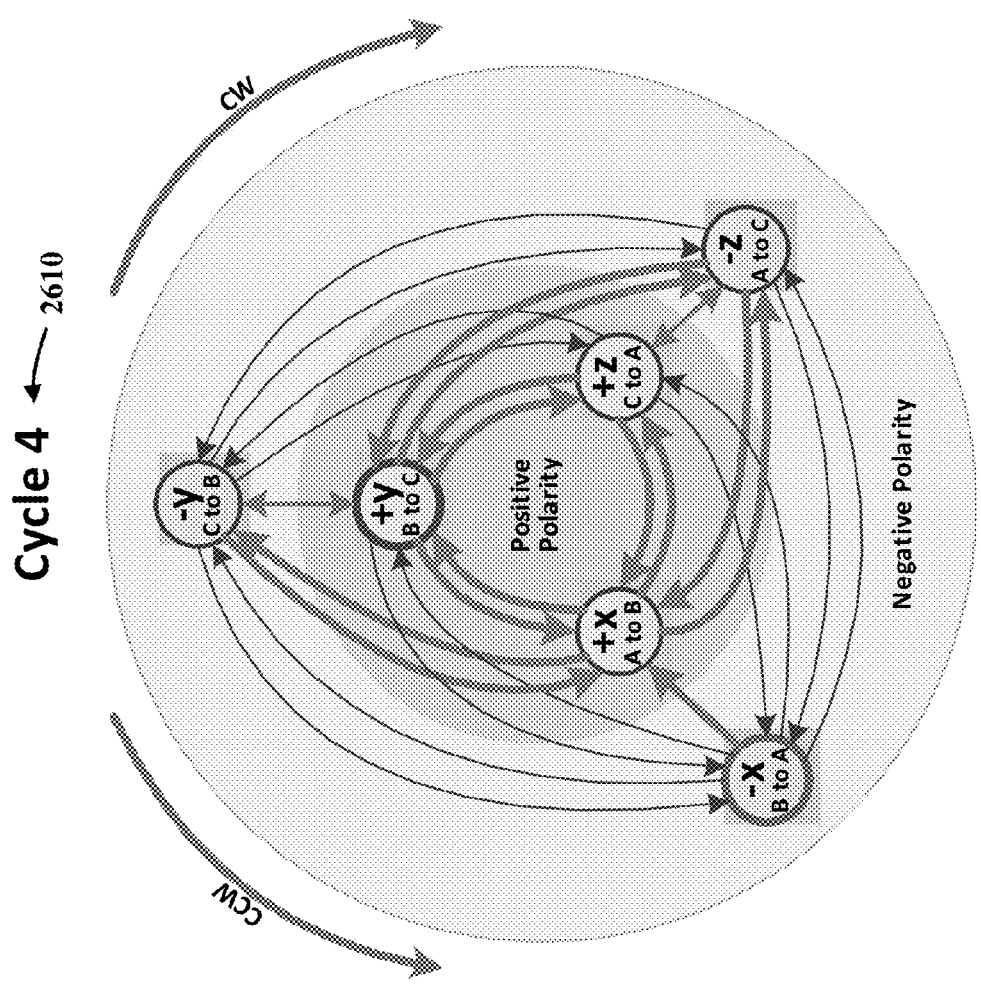

FIG. 30 illustrates a fourth cycle of wire state transitions for the exemplary test pattern provided in FIG. 26.

Figure 31:
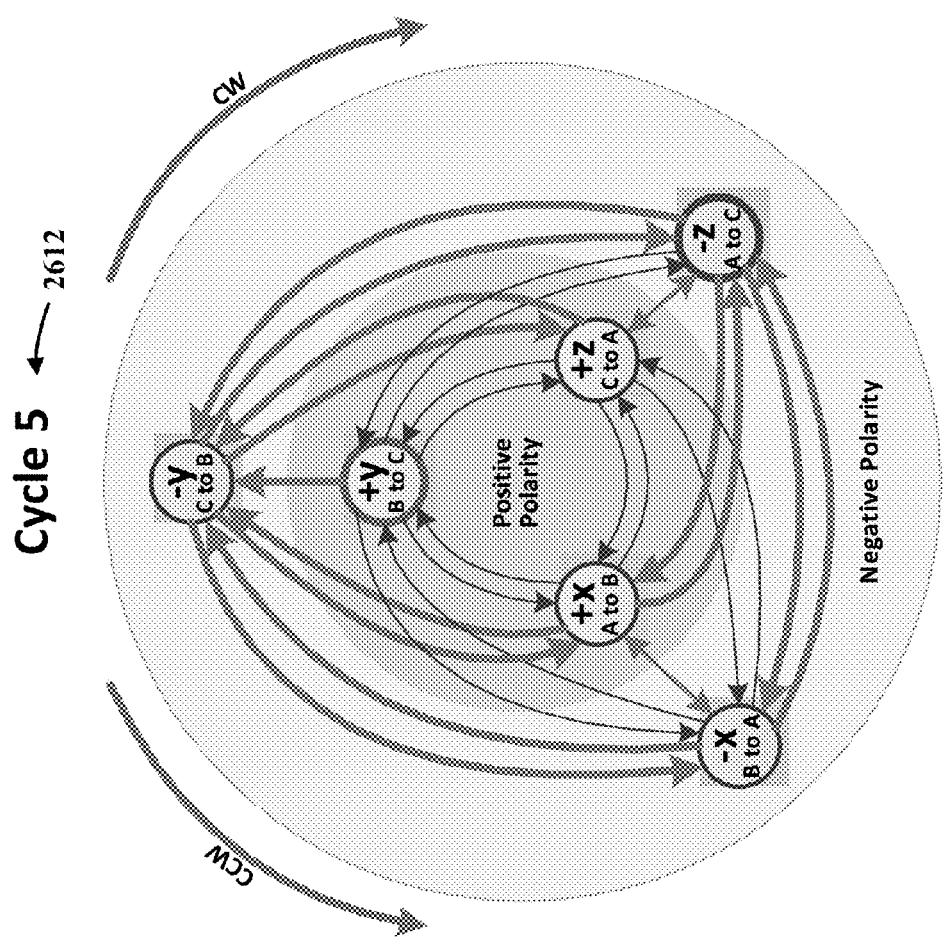

FIG. 31 illustrates a fifth cycle of wire state transitions for the exemplary test pattern provided in FIG. 26.

Figure 32:
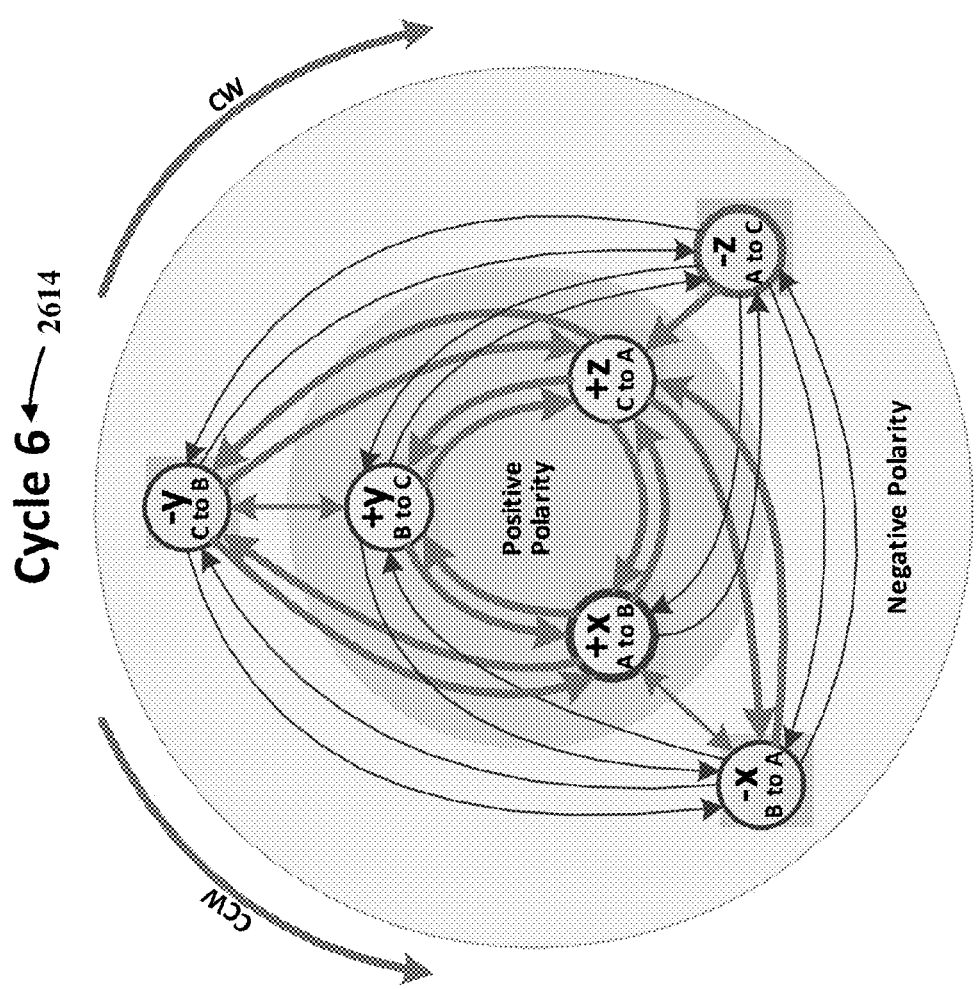

FIG. 32 illustrates a sixth cycle of wire state transitions for the exemplary test pattern provided in FIG. 26.

Figure 33:
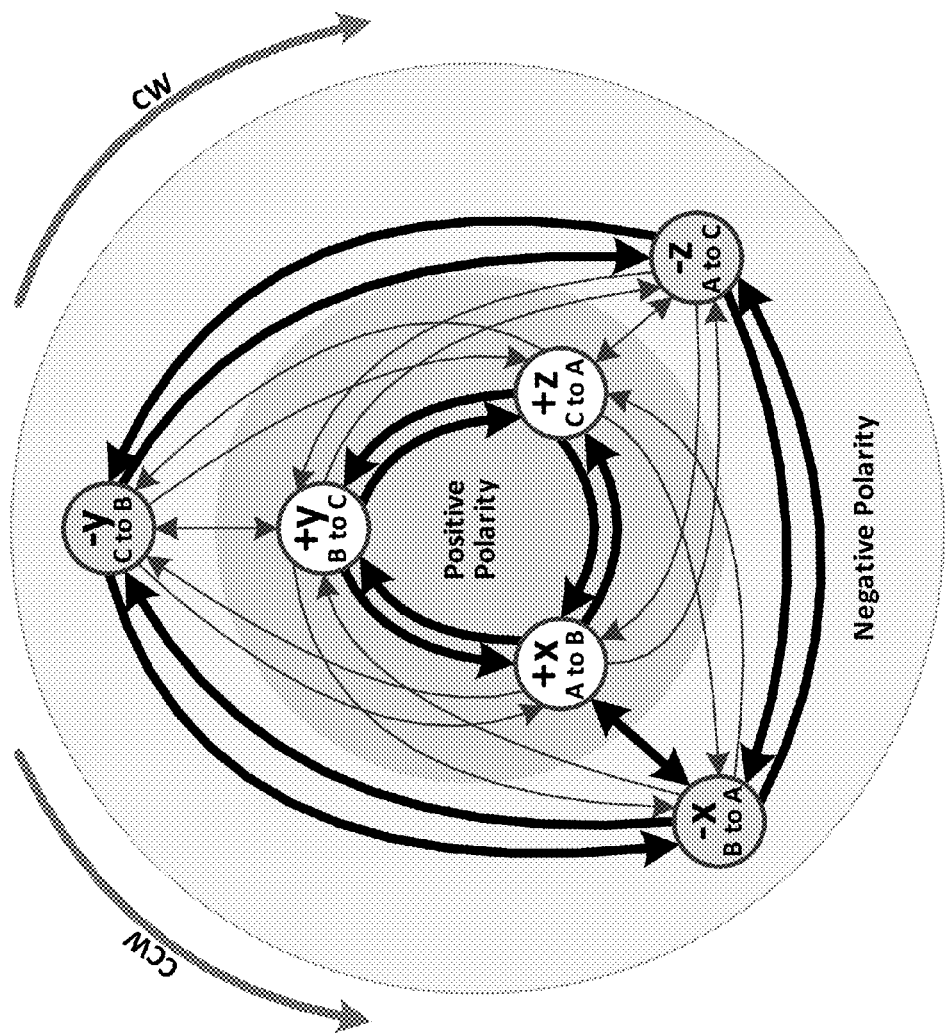

FIG. 33 is a state diagram illustrating strong to weak transition states for an exemplary test pattern in accordance with an aspect of the disclosure.

Figure 34:
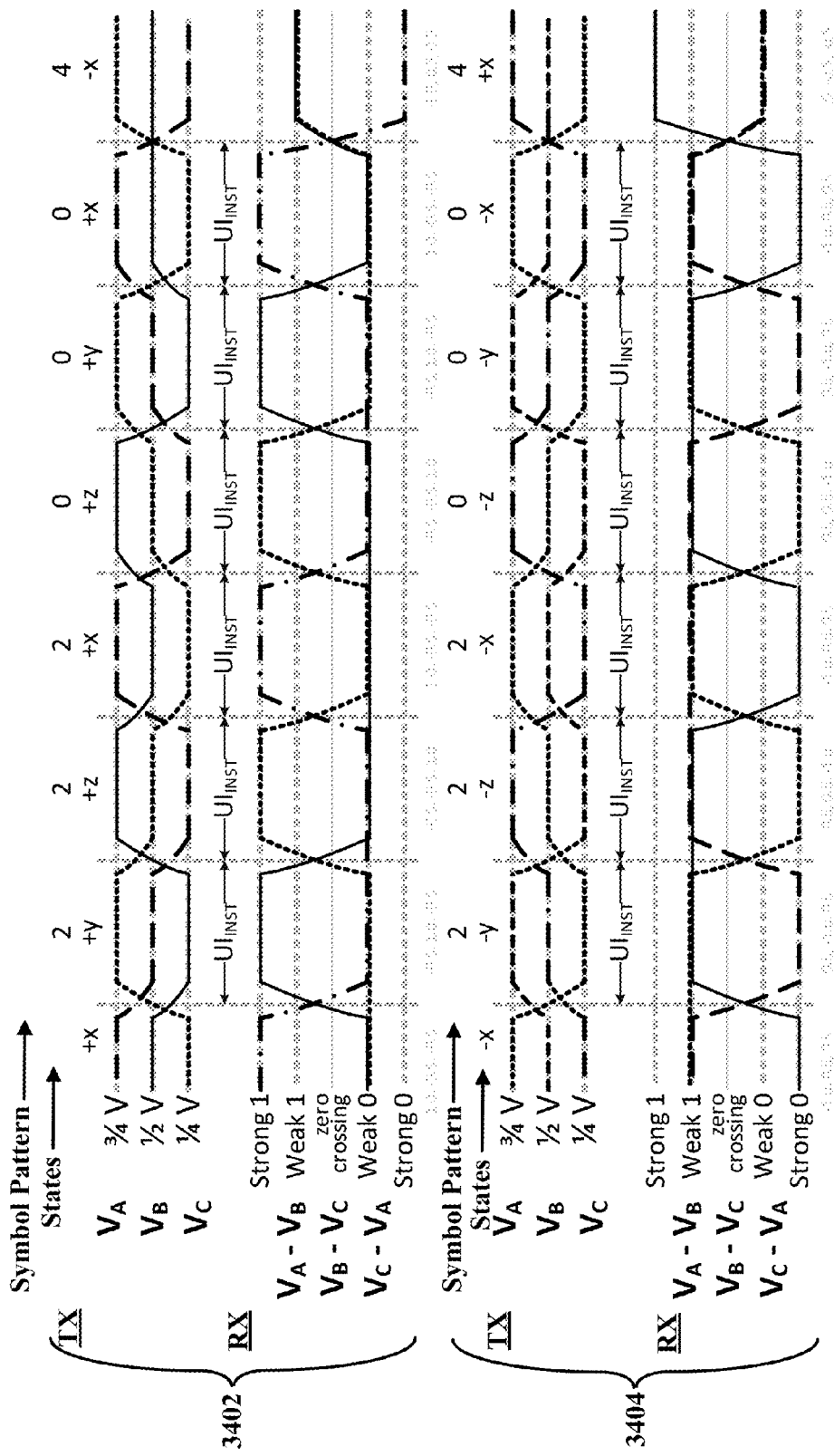

FIG. 34 is a waveform illustrating exemplary strong to weak transitions for the state diagram of FIG. 33.

Figure 35:
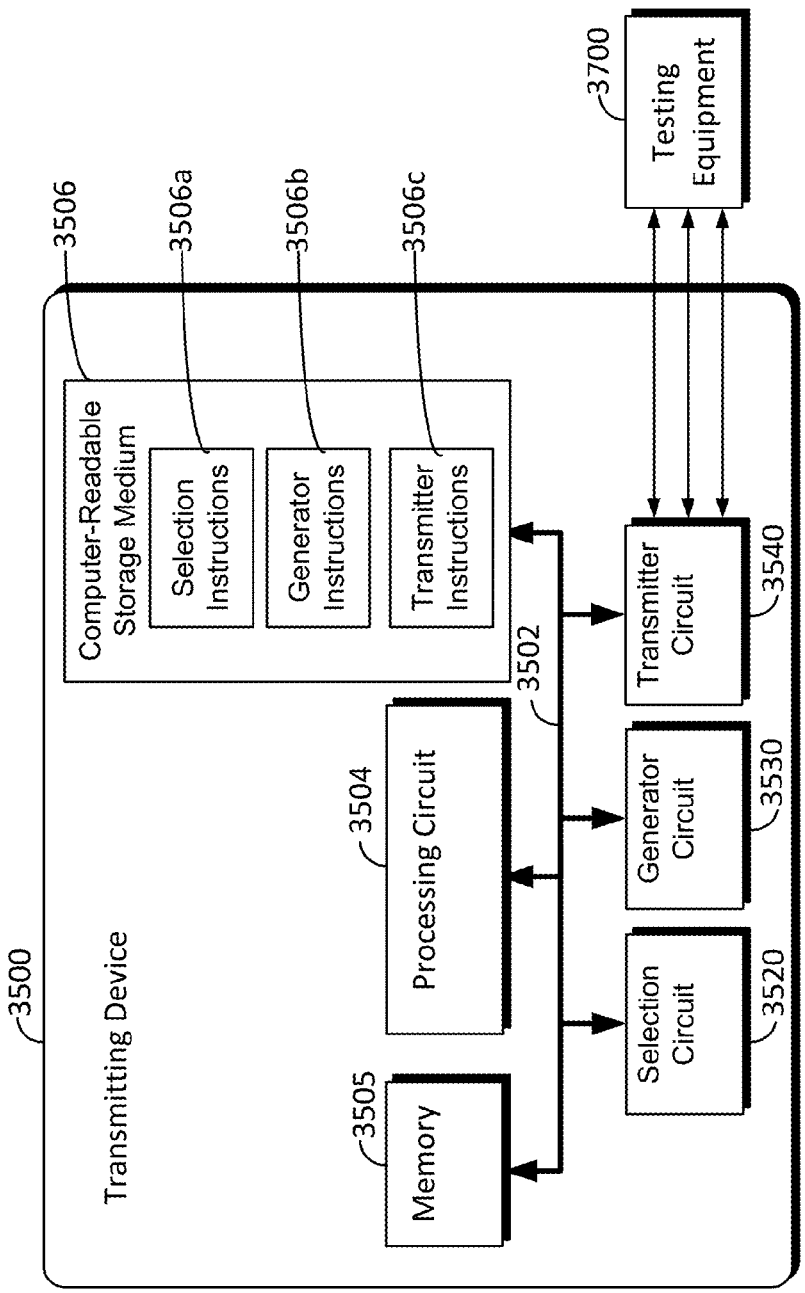

FIG. 35 is a block diagram illustrating an exemplary hardware implementation of a transmitter device according to some aspects described herein.

Figure 36:
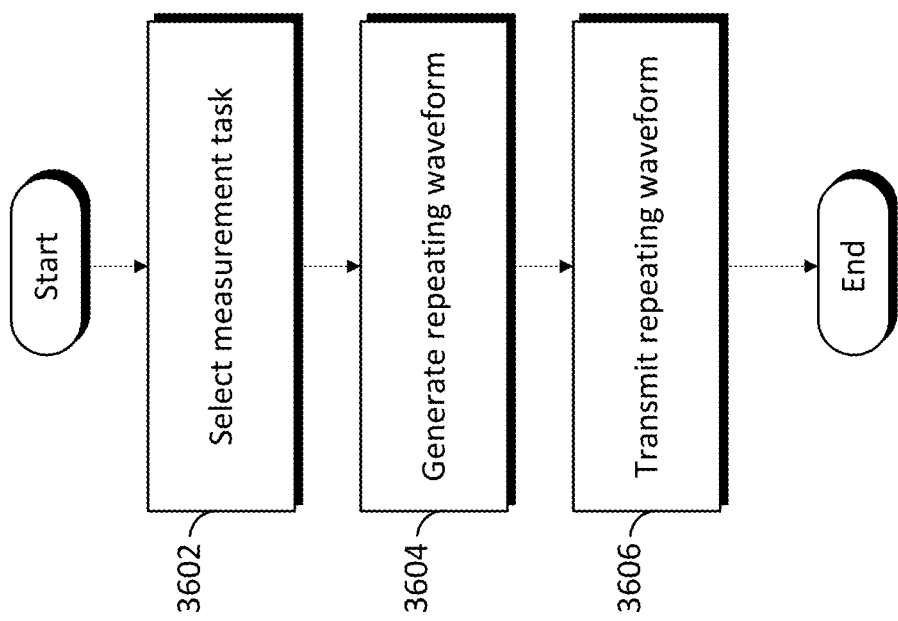

FIG. 36 is a flow chart illustrating an exemplary procedure for implementing one or more aspects disclosed herein from a transmitter device.

Figure 37:
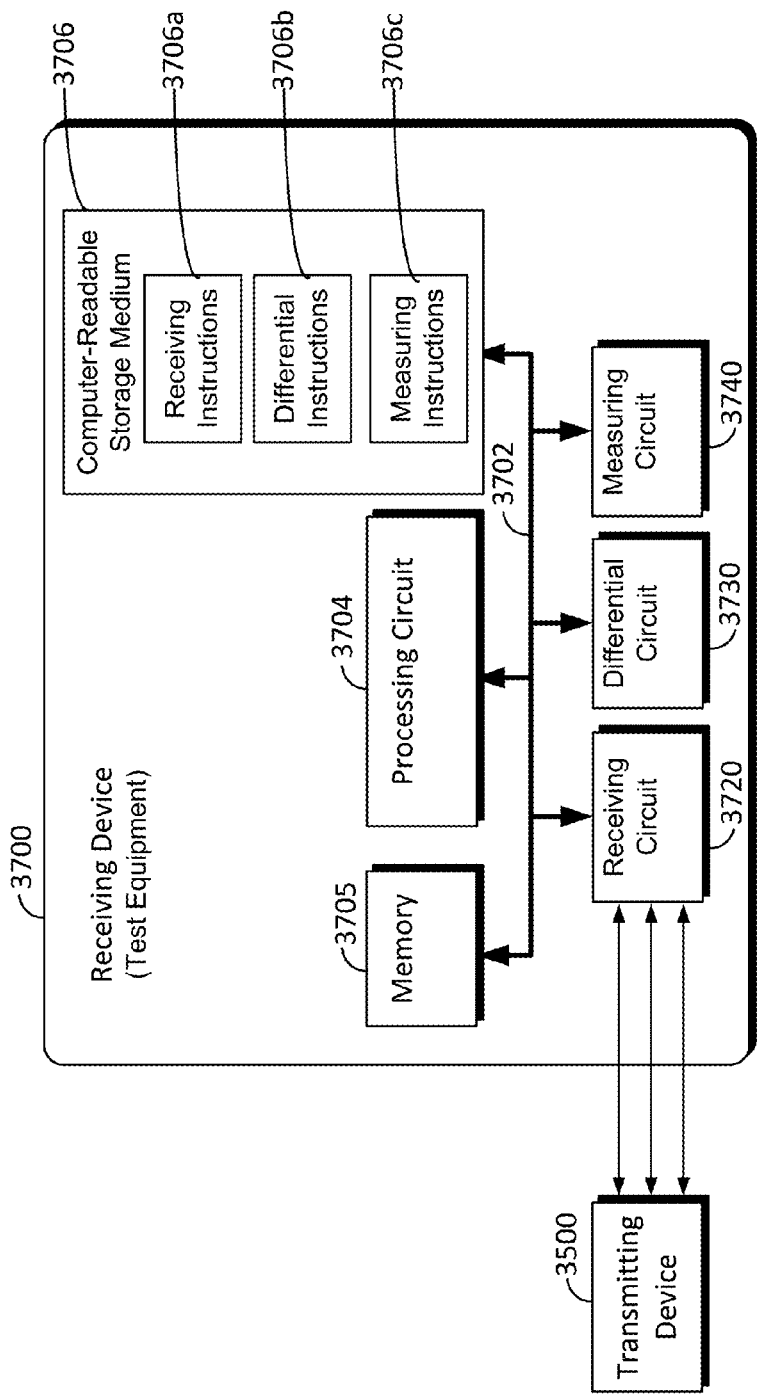

FIG. 37 is a block diagram illustrating an exemplary hardware implementation of a receiving device (e.g., testing equipment) according to some aspects described herein.

Figure 38:
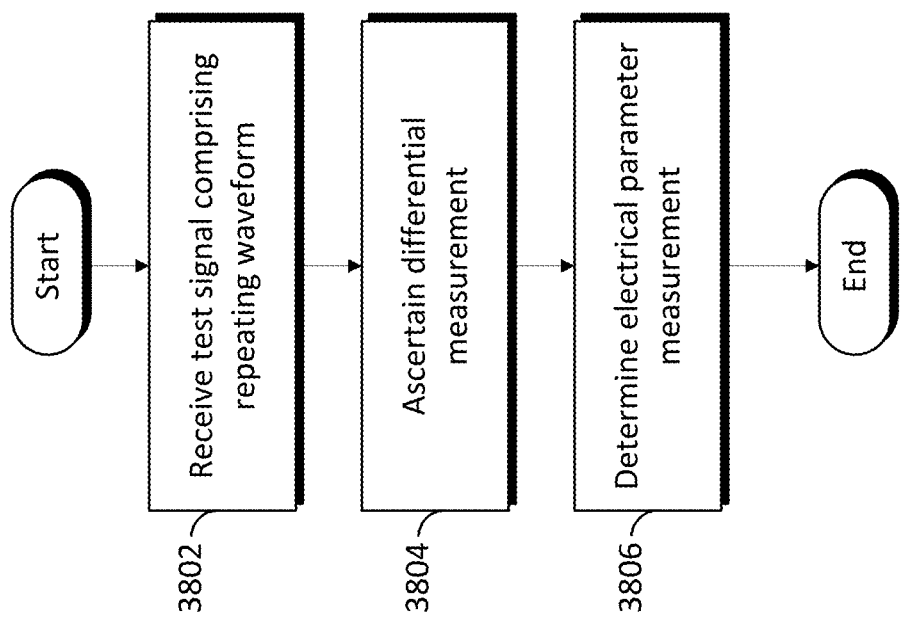

FIG. 38 is a flow chart illustrating an exemplary procedure for implementing one or more aspects disclosed herein from a receiving (measurement/test) device.

Figure 39:
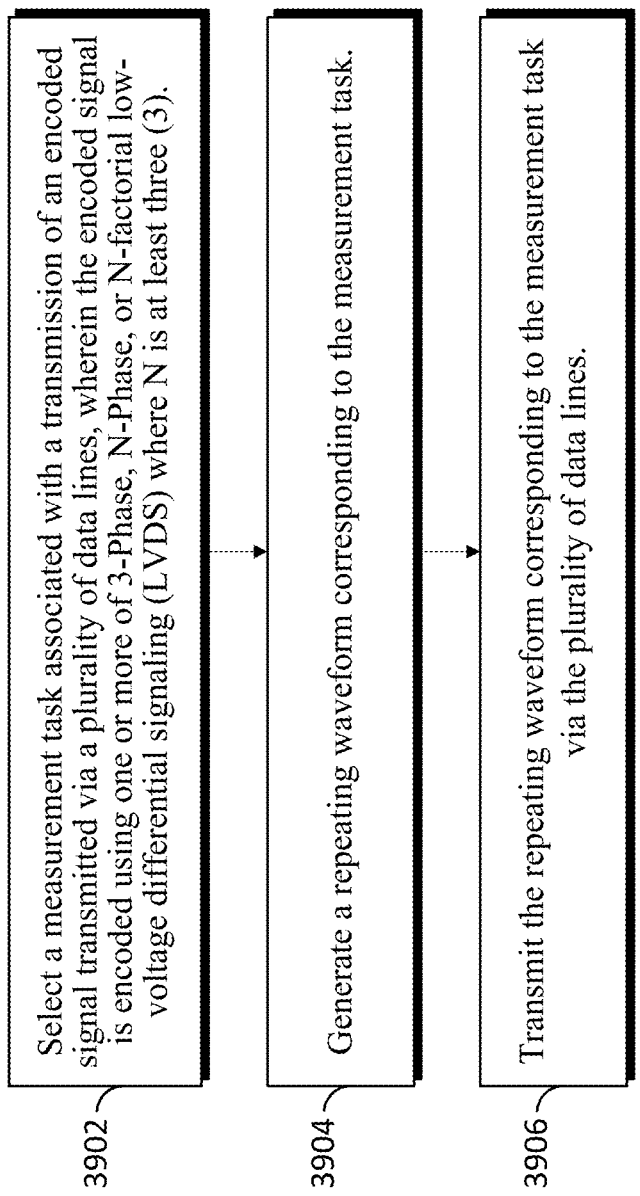

FIG. 39 illustrates an exemplary method operational in a transmitting device to facilitate measurement tasks over a plurality of lines.

Figure 40:
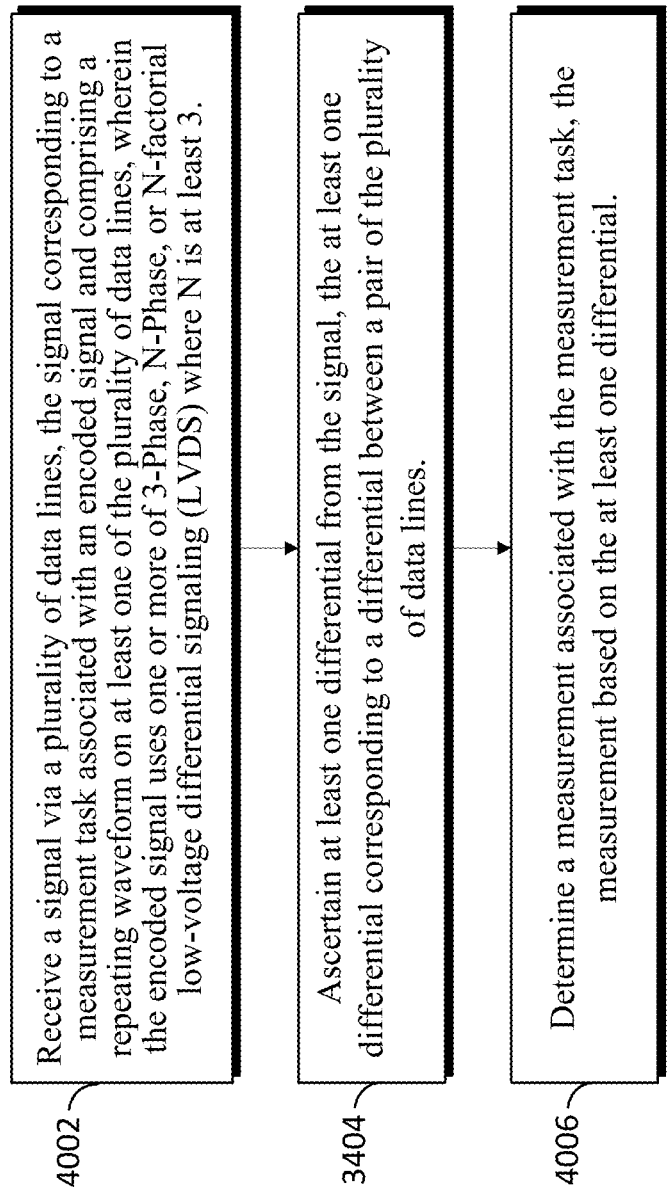

FIG. 40 illustrates an exemplary method operational in a receiving device to facilitate measurement tasks over a plurality of lines.

DETAILED DESCRIPTION

In the following description, specific details are given to provide a thorough understanding of the embodiments. However, it will be understood by one of ordinary skill in the art that the embodiments may be practiced without these specific detail. For example, circuits may be shown in block diagrams in order not to obscure the embodiments in unnecessary detail. In other instances, well-known circuits, structures, and techniques may not be shown in detail in order not to obscure the embodiments.

Overview

In an aspect, waveforms are designed based on a repeating waveform for each of a plurality of measurement tasks. By transmitting such repeating waveforms, a testing device may more reliably perform measurements corresponding to the received waveforms. Inclusion of a programmable pattern generator in each lane of a transmitter is also disclosed, which allows patterns to be readily re-configured for each type of test.

Multi-Phase Data Transfer

Certain disclosed examples relate to systems and apparatus that employ multi-phase data encoding and decoding methods involving a plurality of conductors (i.e., M conductors or wires). The M conductors typically include three or more conductors, and each conductor may be referred to as a wire, even though the M conductors may include conductive traces on a circuit board or within a conductive layer of a semiconductor integrated circuit (IC) device. The M conductors may be divided into a plurality of transmission groups, each group encoding a portion of a block of data to be transmitted. An N-Phase encoding scheme is defined in which bits of data are encoded in phase transitions and polarity changes on the M conductors. In one example, an N-Phase encoding scheme for a 3-wire system may include three phase states and two polarities, providing 6 states and 5 possible transitions from each state. Deterministic voltage and/or current changes may be detected and decoded to extract data from the M conductors. Decoding does not rely on independent conductors, or pairs of conductors and timing information can be derived directly from phase and/or polarity transitions in the M conductors. N-Phase polarity data transfer can be applied to any signaling interface, such as electrical, optical and radio frequency (RF) interfaces, for example.

Figure 1:
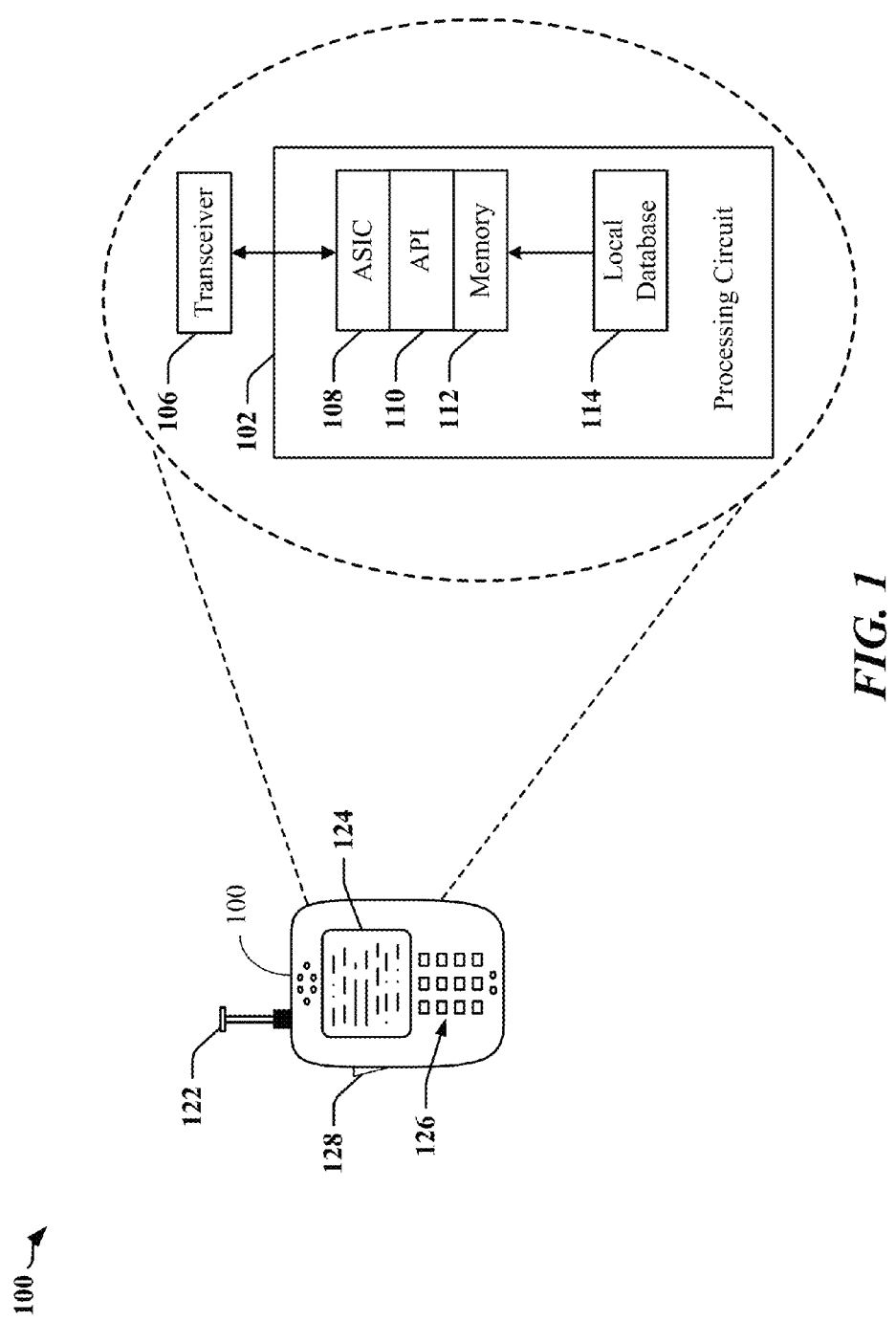
FIG. 1 illustrates an exemplary apparatus that employs an N-Phase polarity encoded data link between devices within the apparatus.

Certain aspects may be applicable to communications links deployed between electronic components, which may include subcomponents of devices such as telephones, mobile computing devices, appliances, automobile electronics, avionics systems, etc. Referring to FIG. 1, for example, an apparatus 100 employing M-wire, N-Phase encoding may include a processing circuit 102 that is configured to control operation of the apparatus 100. The processing circuit 102 may access and execute software applications and control logic circuits and other devices within the apparatus 100. In one example, the apparatus 100 may include a wireless communication device that communicates through an RF communications transceiver 106 with a radio access network (RAN), a core access network, the Internet and/or another network. The communications transceiver 106 may be operably coupled to a processing circuit 102. The processing circuit 102 may include one or more IC devices, such as an application specific IC (ASIC) 108. The ASIC 108 may include one or more processing devices, logic circuits, and so on. The processing circuit 102 may include and/or be coupled to processor readable storage 112 that may maintain instructions and data may be executed by processing circuit 102. The processing circuit 102 may be controlled by one or more of an operating system and an application programming interface (API) 110 layer that supports and enables execution of software modules residing in the storage 112 of the wireless device. The storage 112 may include read-only memory (ROM) or random-access memory (RAM), electrically erasable programmable read-only memory (EEPROM), a flash memory device, or any memory device that can be used in processing systems and computing platforms. The processing circuit 102 may include and/or access a local database 114 that can maintain operational parameters and other information used to configure and operate the apparatus 100. The local database 114 may be implemented using one or more of a database module or server, flash memory, magnetic media, EEPROM, optical media, tape, soft or hard disk, or the like. The processing circuit 102 may also be operably coupled to external devices such as an antenna 122, a display 124, operator controls, such as a button 128 and a keypad 126, among other components.

Figure 2:
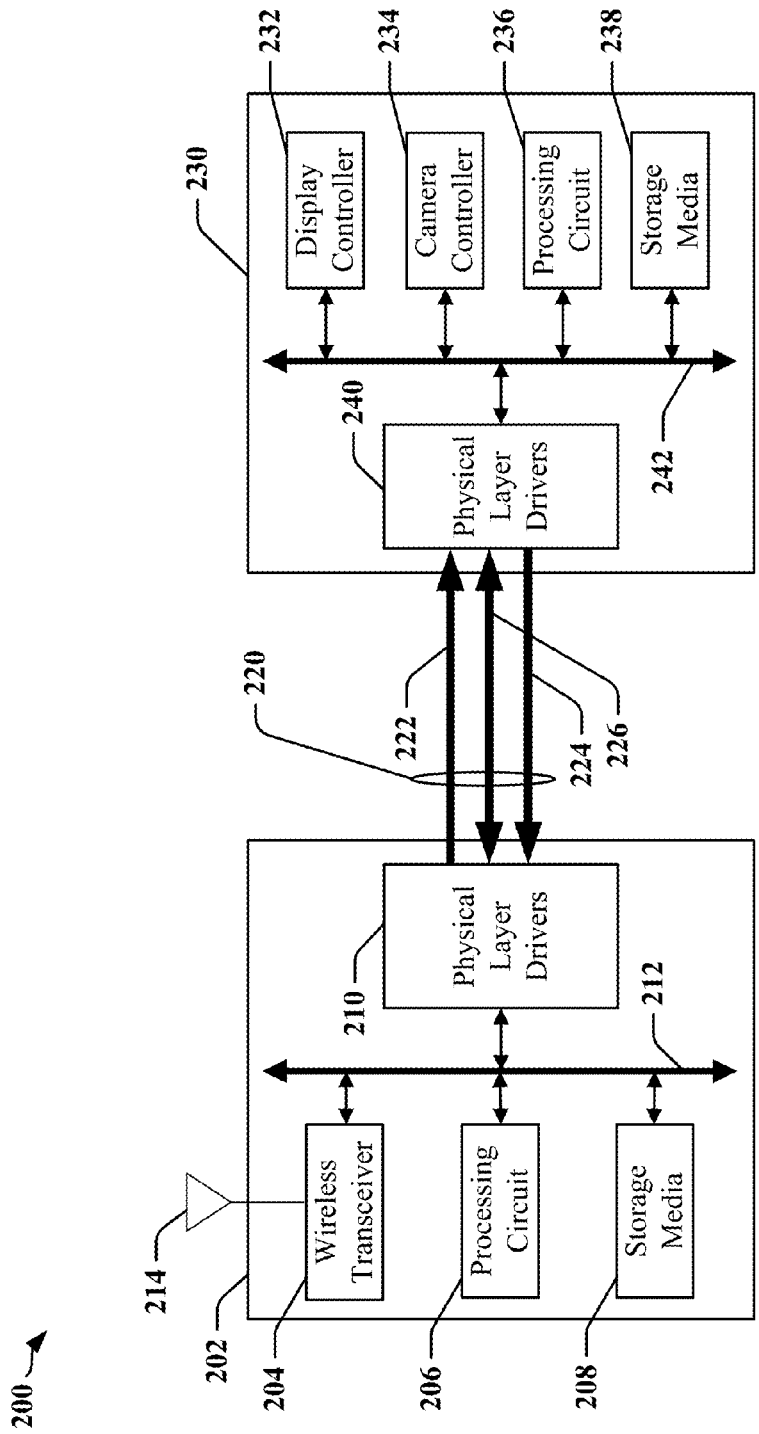
FIG. 2 illustrates an exemplary system architecture for an apparatus employing an N-phase polarity encoded data link.

FIG. 2 illustrates an exemplary system architecture of an apparatus 200 employing an N-Phase polarity encoded data link. The apparatus 200 may be a wireless mobile device, a mobile telephone, a mobile computing system, a wireless telephone, a notebook computer, a tablet computing device, a media player, a gaming device, or the like. The apparatus 200 may include a plurality of IC devices 202 and 230 that exchange data and control information through a communications link 220. The communications link 220 may be used to connect the IC devices 202 and 230, which may be located in close proximity to one another or physically located in different parts of the apparatus 200. In one example, the communications link 220 may be provided on a chip carrier, substrate or circuit board that carries the IC devices 202 and 230. In another example, a first IC device 202 may be located in a keypad section of a flip-phone while a second IC device 230 may be located in a display section of the flip-phone. A portion of the communications link 220 may include a cable or an optical connection.

The communications link 220 may include multiple channels 222, 224 and 226. One or more channel 226 may be bidirectional, and may operate in half-duplex mode and/or full-duplex mode. One or more channels 222, 224 may be unidirectional. The communications link 220 may be asymmetrical, providing higher bandwidth in one direction. In one example described herein, a first communications channel 222 may be referred to as a forward link 222 while a second communications channel 224 may be referred to as a reverse link 224. The first IC device 202 may be designated as a host, master and/or transmitter, while the second IC device 230 may be designated as a client, slave and/or receiver, even if both IC devices 202 and 230 are configured to transmit and receive on the communications link 220. In one example, the forward link 222 may operate at a higher data rate when communicating data from a first IC device 202 to a second IC device 230, while the reverse link 224 may operate at a lower data rate when communicating data from the second IC device 230 to the first IC device 202.

The IC devices 202 and 230 may each include a processor or other processing and/or computing circuit or device 206, 236. In one example, the first IC device 202 may perform core functions of the apparatus 200, including maintaining wireless communications through a wireless transceiver 204 and an antenna 214, while the second IC device 230 may support a user interface that manages or operates a display controller 232, and may control operations of a camera or video input device using a camera controller 234. Other features supported by one or more of the IC devices 202 and 230 may include a keyboard, a voice-recognition component, and other input or output devices. The display controller 232 may include circuits and software drivers that support a display such as a liquid crystal display (LCD) panel, a touch-screen display, an indicator and so on. The storage media 208 and 238 may include transitory and/or non-transitory storage devices adapted to maintain instructions and data used by the respective processing circuits 206 and 236, and/or other components of the IC devices 202 and 230. Communication between each processing circuit 206, 236 and its corresponding storage media 208 and 238 and other modules and circuits may be facilitated by one or more buses 212 and 242, respectively.

The reverse link 224 may be operated in the same manner as the forward link 222. The forward link 222 and the reverse link 224 may be capable of transmitting at comparable speeds or at different speeds, where speed may be expressed as a data transfer rate and/or a clocking rate. The forward and reverse data rates may be substantially the same or may differ by orders of magnitude, depending on the application. In some applications a single bidirectional link 226 may support communications between the first IC device 202 and the second IC device 230. The forward link 222 and/or the reverse link 224 may be configurable to operate in a bidirectional mode when, for example, the forward and reverse links 222 and 224 share the same physical connections and operate in a half-duplex manner.

In certain examples, the reverse link 224 derives a clocking signal from the forward link 222 for synchronization purposes, for control purposes, to facilitate power management and/or for simplicity of design. The clocking signal may have a frequency that is obtained by dividing the frequency of a symbol clock used to transmit signals on the forward link 222. The symbol clock may be superimposed or otherwise encoded in symbols transmitted on the forward link 222. The use of a clocking signal that is a derivative of the symbol clock allows fast synchronization of transmitters and receivers (transceivers 210, 240) and enables fast start and stop of data signals without the need for framing to enable training and synchronization.

In certain examples, a single bidirectional link 226 may support communications between first processing device 202 and the second processing device 230. In some instances, the first processing device 202 and the second processing device 230 provide encoding and decoding of data, address and control signals transmitted between a processing device and memory devices such as dynamic random access memory (DRAM).

In one example, one or more of buses 212 and/or 242 may provide access to double data rate (DDR) SDRAM using M-wire, N-Phase encoding technique. N-Phase polarity encoding devices 210 and/or 240 can encode multiple bits per transition, and multiple sets of wires can be used to transmit and receive data from the SDRAM, control signals, address signals, and so on.

In another example, the communication link 220 includes a high-speed digital interface, such as a mobile display digital interface (MDDI), and one or more data links 222, 224 and 226 may use N-Phase polarity encoding. Transceivers 210 and 240 may encode and decode data transmitted on the communications link 220. The use of N-Phase polarity encoding provides for high speed data transfer and may consume half or less of the power of other interfaces because fewer drivers are active in N-Phase polarity encoded data links 220. N-Phase polarity encoding devices 210 and/or 240 can encode multiple bits per transition on the interface, which may include a bus. In one example, a combination of 3-Phase and polarity encoding may be used to support a wide video graphics array (WVGA) 80 frames per second LCD driver IC without a frame buffer, delivering pixel data at 810 Mbps for display refresh.

According to certain aspects disclosed herein, characteristics of an M-wire, N-Phase polarity communications link may be dynamically modified to accommodate changing operational requirements and circumstances. For example, the number of wires used to transmit an N-Phase signal may be increased to obtain a higher available bandwidth and/or the number of wires used to transmit an NV-Phase signal may be decreased to reduce power consumption by the IC devices 202 and 230. The number of wires used to transmit an N-Phase signal in one direction may be adapted independently of the number of wires used to transmit an N-Phase signal in the other direction. Receiving circuits and transmitting circuits in the physical layer drivers 210 and 240 may be configured using control information transmitted when the communications link 220 is activated after hibernation or power-on. The control information may be transmitted according to a predefined protocol, whereby a minimum number of wires are activated to carry a control message specifying the configuration of the communications link 220, for example. The control message may alternatively or additionally be transmitted with a shutdown command, a wakeup command, and/or in a preamble preceding each transmission. In some examples, the configuration of the communications link 220 may be determined during a training and/or synchronization sequence, whereby the receiving physical layer drivers 210 or 240 monitors the available wires or other conductors for transitions corresponding to an N-Phase signal, in order to determine which wires/conductors are active.

Figure 3:
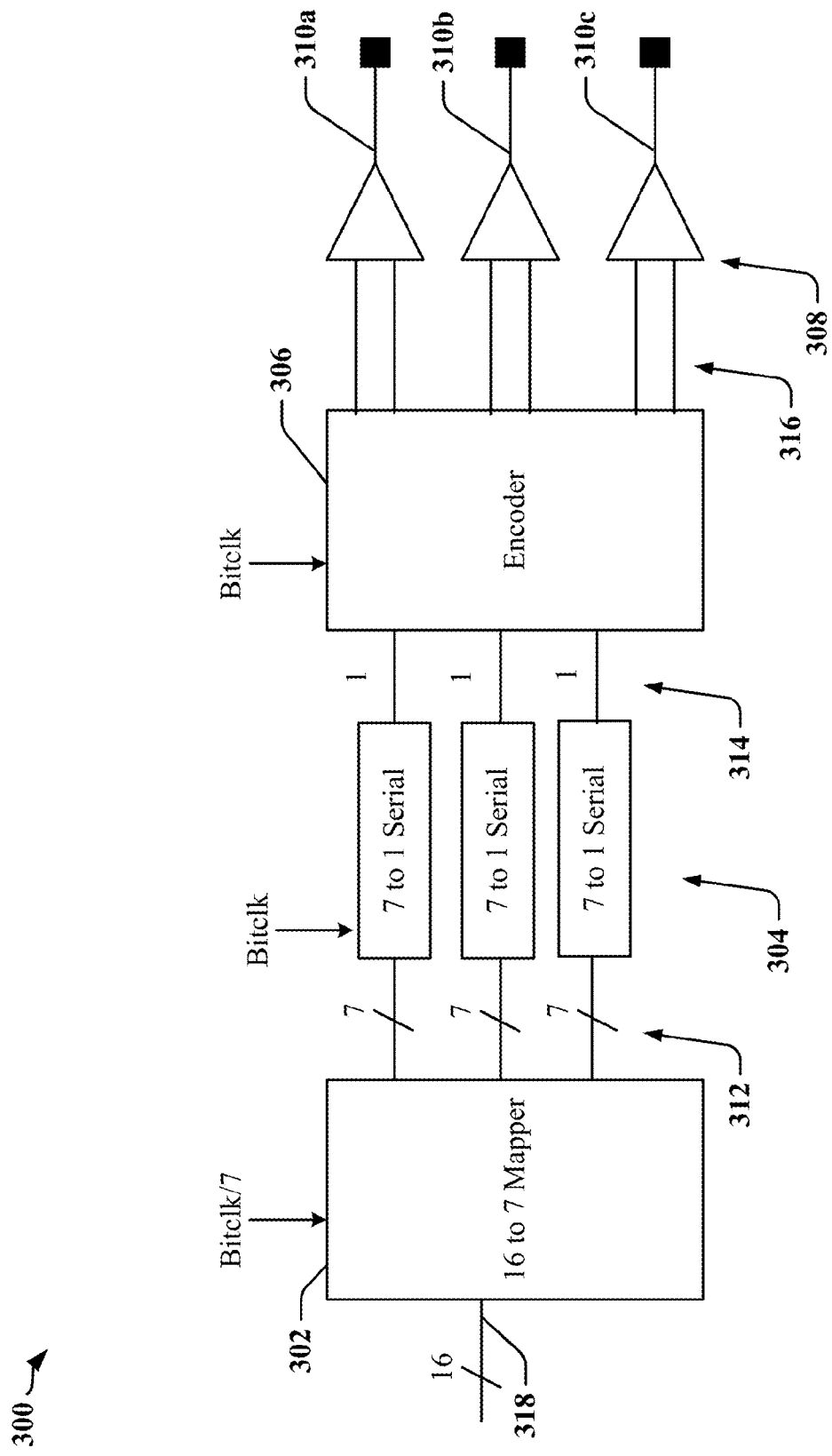
FIG. 3 illustrates an example of an N-Phase polarity data encoder.

FIG. 3 is a diagram 300 illustrating an example of an M-wire, N-Phase polarity encoding transmitter configured for M=3 and N=3. The example of 3-wire, 3-Phase encoding is selected solely for the purpose of simplifying descriptions of certain aspects of this disclosure. The principles and techniques disclosed for 3-wire, 3-Phase encoders can be applied in other configurations of M-wire, N-Phase polarity encoders.

When N-Phase polarity encoding is used, connectors such as signal wires 310*a*, 310*b* and 310*c* on an M-wire bus may be undriven, driven positive, or driven negative. An undriven signal wire 310*a*, 310*b* or 310*c* may be in a high-impedance state. An undriven signal wire 310*a*, 310*b* or 310*c* may be driven to a voltage level that lies substantially halfway between the positive and negative voltage levels provided on driven signal wires. An undriven signal wire 310*a*, 310*b* or 310*c* may have no current flowing through it. In the example illustrated in FIG. 3, each signal wire 310*a*, 310*b* and 310*c* may be in one of three states (denoted as +1, −1, and 0) using drivers 308. In one example, drivers 308 may include unit-level current-mode drivers. In another example, drivers 308 may drive opposite polarity voltages on two signals 310*a* and 310*b* while the third signal 310*c* is at high impedance and/or pulled to ground. For each transmitted symbol interval, at least one signal is in the undriven (0) state, while the number of signals driven positive (+1 state) is equal to the number of signals driven negative (−1 state), such that the sum of current flowing to the receiver is always zero. For each pair of consecutive symbol transmission intervals, at least one signal wire 310*a*, 310*b* or 310*c* has a different state in the two symbol transmission intervals.

In the example depicted in FIG. 3, 16-bit data 318 is input to a mapper 302, which maps the input data 318 to 7 symbols 312 for transmitting sequentially over the signal wires 310*a*, 310*b* and 310*c*. The 7 symbols 312 may be serialized, using parallel-to-serial converters 304 for example. An M-wire, N-Phase encoder 306 receives 7 symbols 312 produced by the mapper one symbol at a time and computes the state of each signal wire 310*a*, 310*b* and 310*c* for each symbol interval. The encoder 306 selects the states of the signal wires 310a, 310b and 310c based on the input symbol and the previous states of signal wires 310a, 310b and 310c.

The use of M-wire, N-Phase encoding permits a number of bits to be encoded in a plurality of symbols where the bits per symbol is not an integer. In the simple example of a 3-wire system, there are 3 available combinations of 2 wires that may be driven simultaneously, and 2 possible combinations of polarity on the pair of simultaneously driven wires, yielding 6 possible states. Since each transition occurs from a current state, 5 of the 6 states are available at every transition. The state of at least one wire is required to change at each transition. With 5 states, $\log_2(5) \cong 2.32$ bits may be encoded per symbol. Accordingly, a mapper may accept a 6-bit word and convert it to 7 symbols because 7 symbols carrying 2.32 bits per symbol can encode 16.24 bits. In other words, a combination of seven symbols that encodes five states has $5^7$ (78,125) permutations. Accordingly, the 7 symbols may be used to encode the $2^{16}$ (65,536) permutations of 16 bits.

Figure 4:
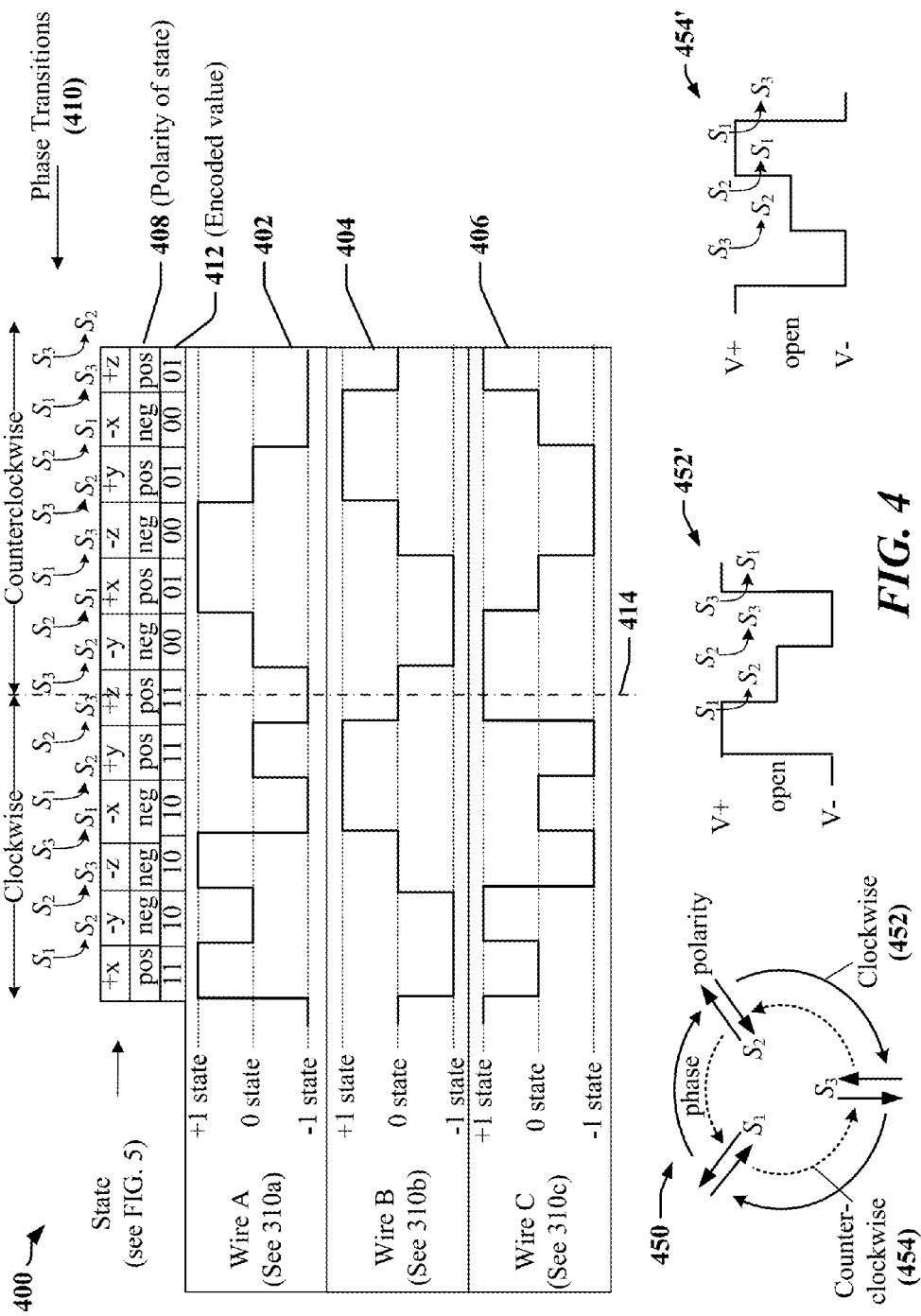
FIG. 4 illustrates exemplary signaling in an N-Phase polarity encoded interface.

FIG. 4 illustrates an example of signaling 400 employing a 3-Phase modulation data-encoding scheme based on the circular state transition diagram 450. According to the data-encoding scheme, a 3-Phase signal may rotate in two directions and may be transmitted over three conductors 310a, 310b and 310c. Each of the three signals is independently driven on the conductors 310a, 310b. 310c. Each of the three signals includes the 3-Phase signal, with each signal on each conductor 310a, 310b and 310c being 120 degrees out of Phase relative to the signals on the other two conductors 310a, 310b and 310c. At any point in time, each of the three conductors 310a, 310b, 310c is in a different one of the states {+1, 0, −1}. At any point in time, each of the three conductors 310a, 310b, 310c in a 3-wire system is in a different state than the other two wires. When more than three conductors or wires are used, two or more pairs of wires may be in the same state. The illustrated encoding scheme also encodes information in the polarity of the two conductors 310a, 310b, and/or 310c that are actively driven to the +1 and −1 states. Polarity 408 is indicated for each of the sequence of states.

At any Phase state in the illustrated three-wire example, exactly two of the conductors 310a, 310b, 310c carry a signal which is effectively a differential signal for that Phase state, while the third conductor 310a, 310b or 310c is undriven. The Phase state for each conductor 310a, 310b, 310c may be determined by voltage difference between the conductor 310a, 310b or 310c and at least one other conductor 310a, 310b and/or 310c, or by the direction of current flow, or lack of current flow, in the conductor 310a, 310b or 310c. As shown in the state transition diagram 450, three Phase states ($S_1$, $S_2$ and $S_3$) are defined. A signal may flow clockwise from Phase state $S_1$ to Phase state $S_2$, Phase state $S_2$ to Phase state $S_3$, and/or Phase state $S_3$ to Phase state $S_1$ and the signal may flow counter-clockwise from Phase state $S_1$ to Phase state $S_3$, Phase state $S_3$ to Phase state $S_2$, and/or Phase state $S_2$ to Phase state $S_1$. For other values of N, transitions between the N states may optionally be defined according to a corresponding state diagram to obtain circular rotation between state transitions.

In the example of a three-wire, 3-Phase communications link, clockwise rotations ($S_1$ to $S_2$), ($S_2$ to $S_3$), and/or ($S_3$ to $S_1$) at a state transition may be used to encode a logic 1, while counter-clockwise rotations ($S_1$ to $S_3$), ($S_3$ to $S_2$), and/or ($S_2$ to $S_1$) at the state transition may be used to encode a logic 0. Accordingly a bit may be encoded at each transition by controlling whether the signal is "rotating" clockwise or counter-clockwise. For example, a logic 1 may be encoded when the three wires 310a, 310b, 310c transition from Phase state $S_1$ to Phase state $S_2$ and a logic 0 may be encoded when the three wires 310a, 310b, 310c transition from Phase state $S_1$ to Phase state $S_3$. In the simple three-wire example depicted, direction of rotation may be easily determined based on which of the three wires 310a, 310b, 310c is undriven before and after the transition.

Information may also be encoded in the polarity of the driven conductors 310a, 310b, 310c or direction of current flow between two conductors 310a, 310b, 310c. Signals 402, 404, and 406 illustrate voltage levels applied to conductors 310a, 310b, 310c, respectively at each Phase state in a three-wire, 3-Phase link. At any time, a first conductor 310a, 310b, 310c is coupled to a positive voltage (+V, for example), a second conductor 310a, 310b, 310c is coupled to a negative voltage (−V, for example), while the third conductor 310a, 310b, 310c may be open-circuited or otherwise undriven. As such, one polarity encoding state may be determined by the current flow between the first and second conductors 310a, 310b, 310c or the voltage polarities of the first and second conductors 310a, 310b, 310c. In some embodiments, two bits of data may be encoded at each Phase transition. A decoder may determine the direction of signal Phase rotation to obtain the first bit, and the second bit may be determined based on the polarity difference between two of the signals 402, 404 and 406. The decoder having determined direction of rotation can determine the current Phase state and the polarity of the voltage applied between the two active connectors 310a, 310b and/or 310c, or the direction of current flow through the two active conductors 310a, 310b and/or 310c.

In the example of the three-wire, 3-Phase link described herein, one bit of data may be encoded in the rotation, or Phase change in the three-wire, 3-Phase link, and an additional bit may be encoded in the polarity of two driven wires. Certain embodiments, encode more than two bits in each transition of a three-wire, 3-Phase encoding system by allowing transition to any of the possible states from a current state. Given three rotational Phases and two polarities for each Phase, 6 states are defined, such that 5 states are available from any current state. Accordingly, there may be $\log_2(5) \cong 2.32$ bits per symbol (transition) and the mapper may accept a 16-bit word and convert it to 7 symbols.

Figure 5:
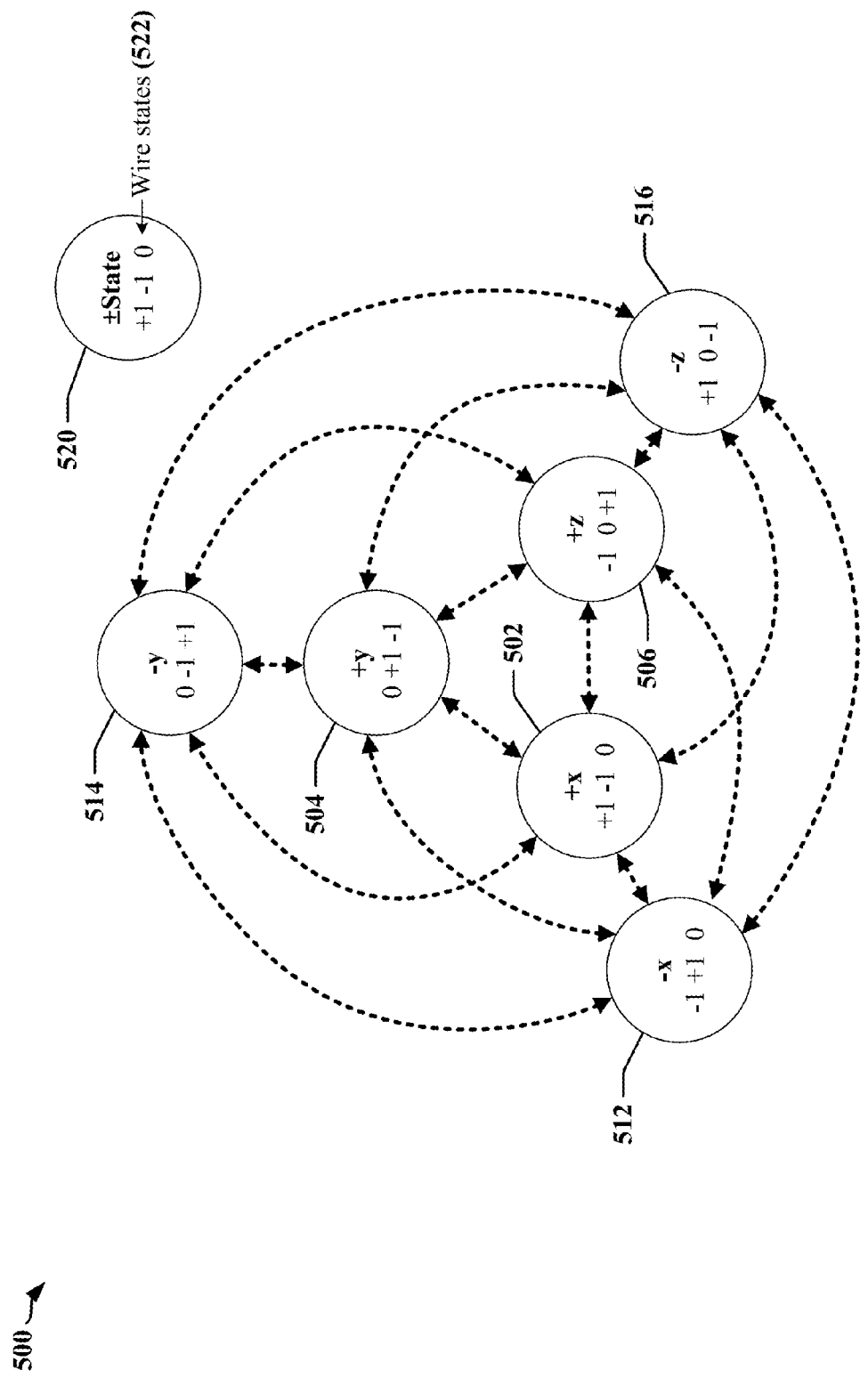
FIG. 5 is a state diagram illustrating state transitions in the example of a 3-wire, 3-Phase communication link.

FIG. 5 is a state diagram 500 illustrating 6 states and 30 possible state transitions in the example of a 3-wire, 3-Phase communication link. FIG. 5 expands on the state transition diagram 450 in FIG. 4 by depicting all possible states 502, 504, 506, 512, 514 and 516. These states 502, 504, 506, 512, 514 and 516 include positive polarity and negative polarity versions of the Phase states $S_1$, $S_2$ and $S_3$ illustrated in the Phase transition diagram 450 of FIG. 4. For clarity, the set of Phase/polarity states are labeled alphabetically and includes {+x, −x, +y, −y, +z, −z} where, for example, +x and −x represent states with the same Phase state but different polarity. As shown in the model state element 520, each state 502, 504, 506, 512, 514 and 516 in the state diagram 500 includes a field 522 showing the voltage state of signals 402, 404 and 406, which are transmitted on wires 310a, 310b and 310c, respectively. For example, in state 502 (+x) signal 402=+1, signal 404=−1 and signal 406=0. Also shown in FIG. 5 are the 5 possible transition paths between the states 502, 504, 506, 512, 514 and 516, including by way of example, the transition path 524 between −x state 512 and −y state 514.

Figure 6:
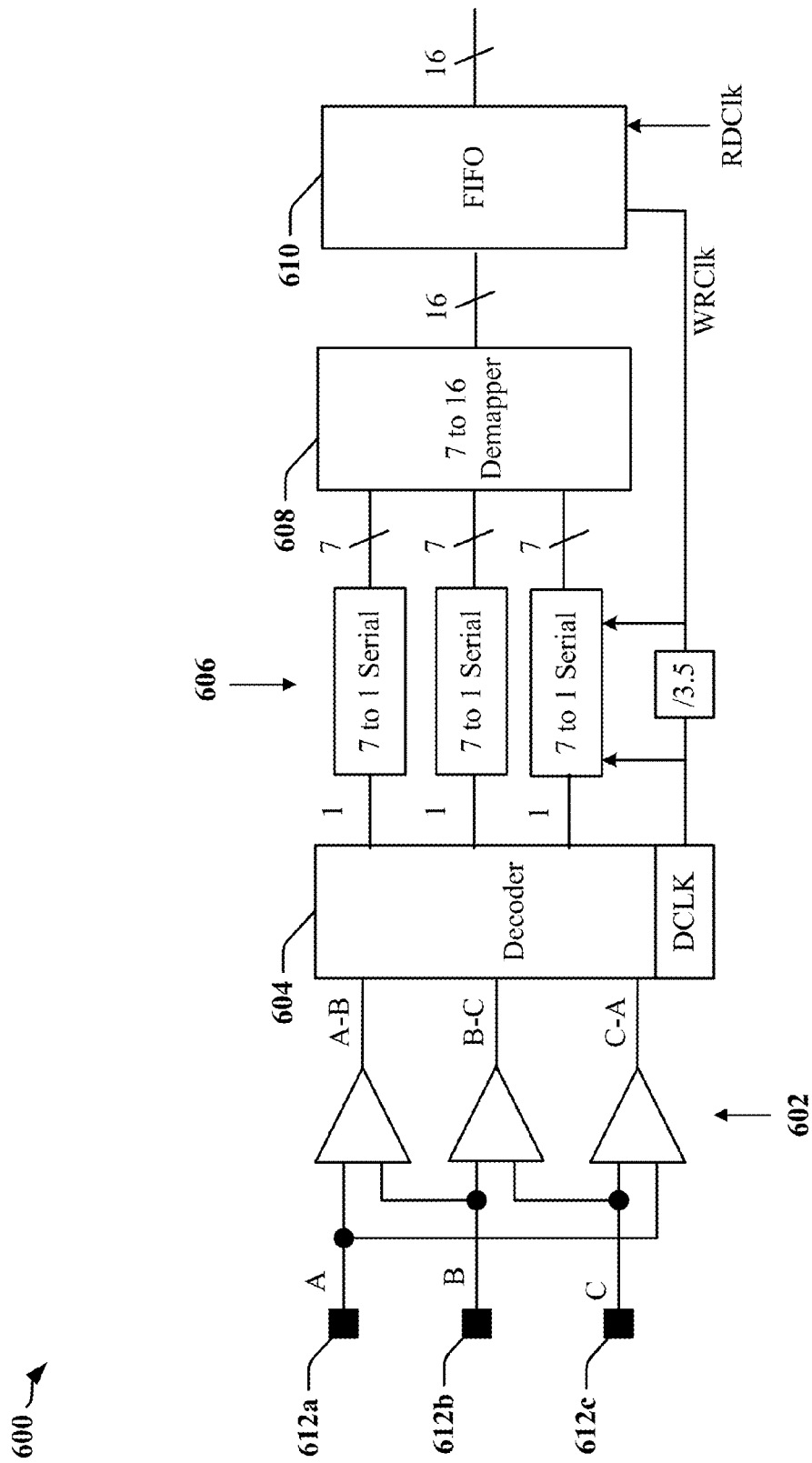
FIG. 6 illustrates a block diagram of an exemplary 3-Phase polarity data decoder.

FIG. 6 is a block diagram 600 illustrating an example of a receiver in a 3-Phase PHY. Comparators 602 and decoder 604 are configured to provide a digital representation of the state of each of three transmission lines 612a, 612b and 612c, as well as the change in the state of the three transmission lines compared to the state transmitted in the previous symbol period. As can be seen from the illustrated example, the voltage of each connector 612a, 612b or 612c may be compared to the voltages of the other two connectors 612a, 612b and/or 612c to determine the state of each connector 612a, 612b or 612c, such that the occurrence of a transition may be detected and decoded by the decoder 604 based on the outputs of the comparators 602. Seven consecutive states are assembled by serial to parallel convertors 606, which produce sets of 7 symbols to be processed by demapper 608 to obtain 16 bits of data that may be buffered in the FIFO 610.

Multi-Phase Testing and Measurements

As previously stated, physical layer testing of a 3-Phase or N-Phase system is much more challenging than testing conventional differential data. A few factors that cause this complexity are the multiple signal levels, a larger number of states at the receiving side, and a larger diversity of possible transitions between consecutive wire states sent over the physical interface.

As can be appreciated from FIGS. 1-6, 3-Phase encoding systems send data over three wires, whereas N-Phase and N-Factorial signaling sends data over N wires. In these systems, because multiple strengths of one and zero appear at the differential receiver inputs in the receiving side, it can be challenging to measure the individual received signal levels during normal operation. It is even more challenging to measure just the strongest one and zero level while transmitting pseudo-random data. The wire state transition region includes inherent jitter due to the different transition times through the zero-crossing levels. These different transition times to the zero-crossing are inherent to 3-Phase and N-Phase systems. It is difficult to measure the jitter of the internal transmit symbol rate clock because the inherent jitter caused by multiple zero-crossing transitions of the 3-Phase signal is often larger than the jitter of the internal symbol rate clock. Furthermore, because there are eight possible cases of transitions that can occur, the measurement of signal rise and fall times is difficult in pseudo-random data as well. It should be noted that, although most of the examples disclosed herein are discussed within the context of a 3-Phase transmitter, the disclosed aspects may be similarly applied to N-Phase and N-Factorial transmitters.

3-Phase Signal Testing and Measurement Complications

A received 3-Phase signal has four levels due to the low, mid, and high levels of the driver circuit which cause strong and weak ones and zeros to appear across the three differential pairs at the receiver. Namely, there are three ways to receive two signals, wherein there are a total of three signals.

Figure 7:
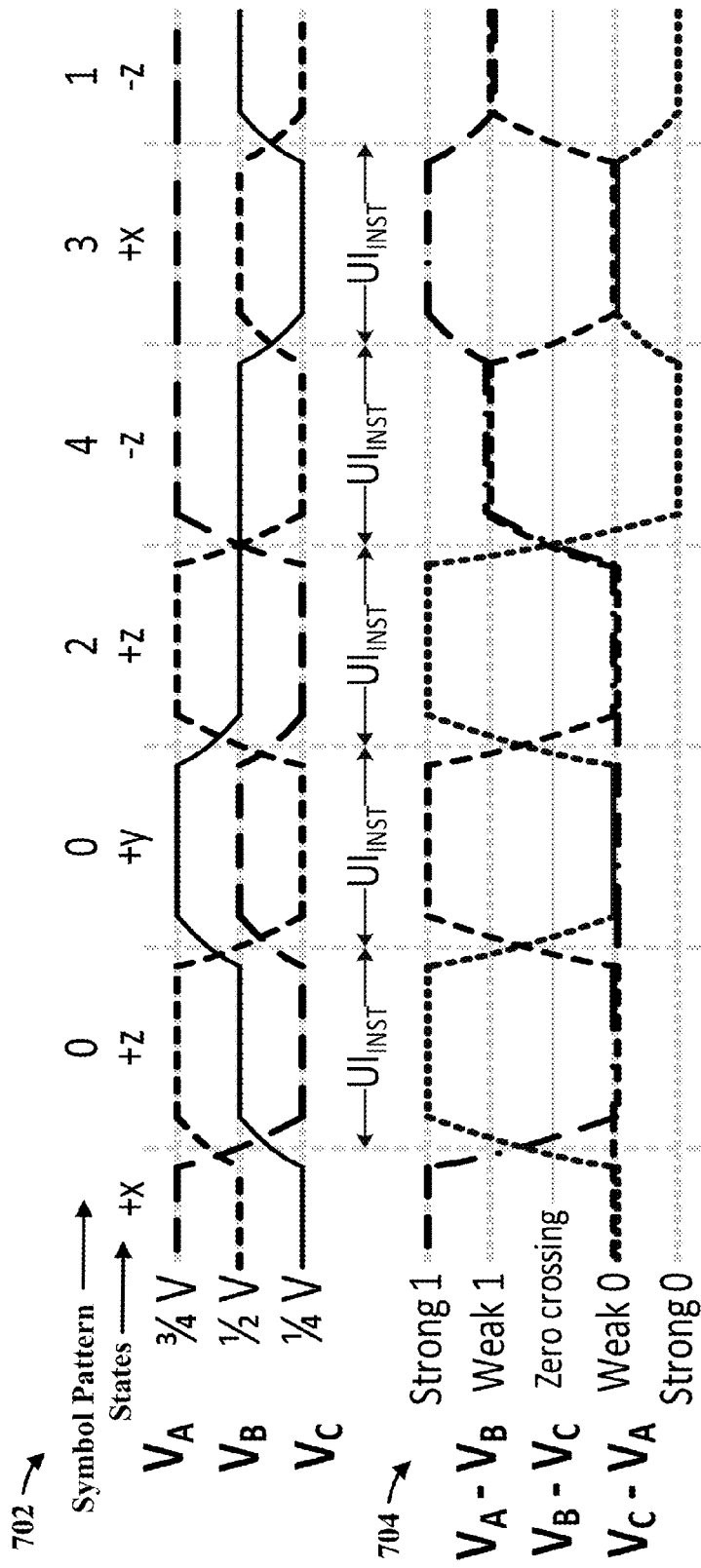
FIG. 7 illustrates an exemplary 3-Phase driver output and differential input at three receivers.

FIG. 7 illustrates exemplary 3-Phase driver output signals 702 from a transmitter and differential input signals 704 at a receiver. The output signals 702 from the driver include three signals at three distinct voltage levels $V_A$, $V_B$, and $V_C$. For each unit interval (UI), different states (+x, +z, +y, +z, −z, +x, and −z) are defined by the combination of voltage levels $V_A$, $V_B$, and $V_C$, where each state is also based on a transition from a preceding state. The differential input signals 704 at the receiver include three signals $V_A-V_B$, $V_B-V_C$, and $V_C-V_A$.

Figure 8:
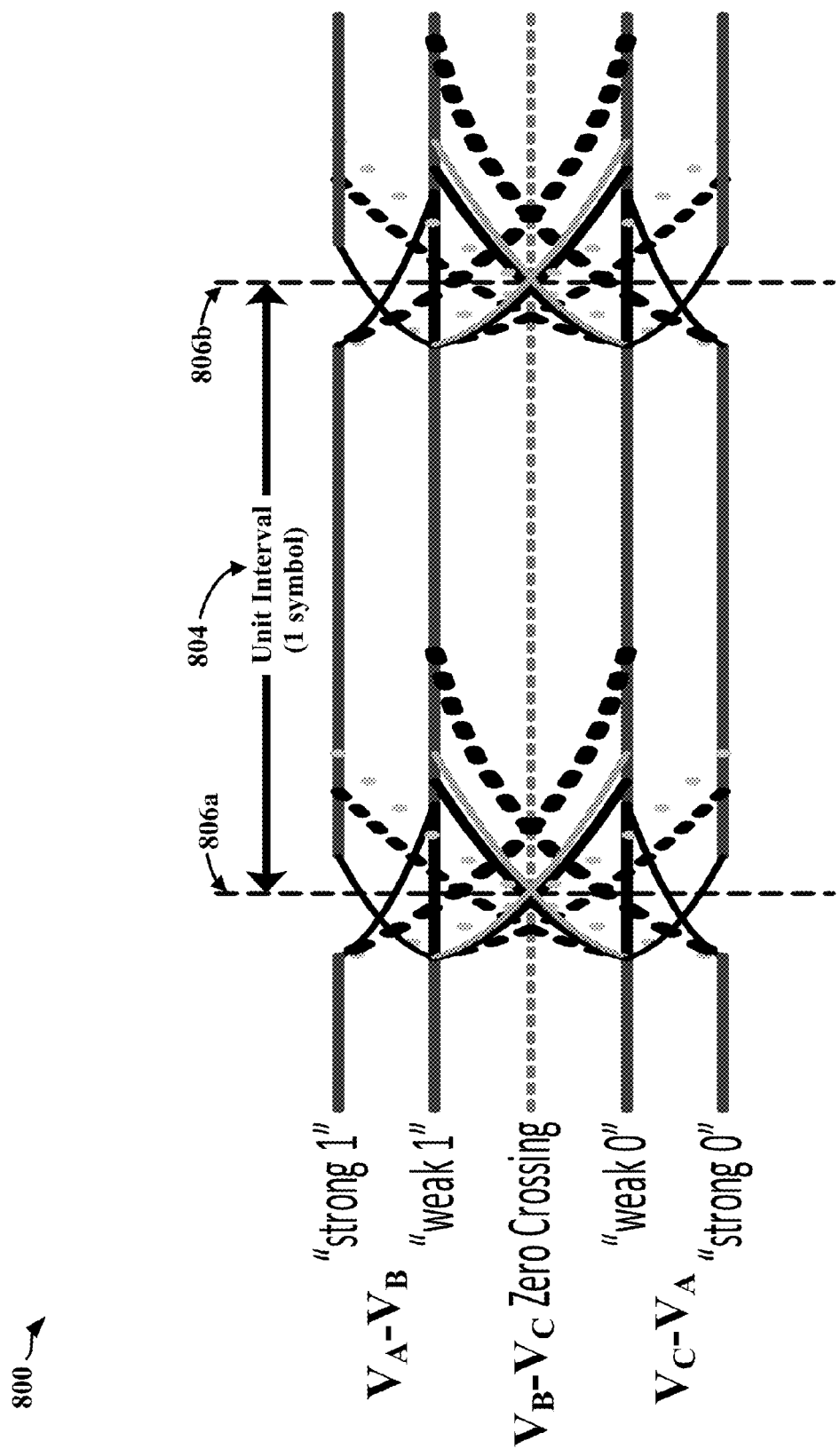
FIG. 8 illustrates an exemplary eye pattern display of a 3-Phase signal.

FIG. 8 illustrates an exemplary eye pattern display of a 3-Phase signal as perceived at a receiver. FIG. 8 is not the recommended/optimal eye diagram for a 3-Phase system, but rather this exemplary eye diagram view illustrates the different zero-crossing times compared to the ideal unit interval (UI) boundaries 806a and 806b. The ideal symbol boundaries 806a and 806b are the endpoints of the "1 UI" 804 in illustrated in FIG. 8. In this view, all captured waveforms of the differential signals A-B, B-C, and C-A are overlapped to display a view that shows the relative time offset of all low-to-high and high-to-low transitions with respect to the ideal symbol boundary time. The ideal symbol boundary points would be the mid-point crossing of the signal for a received signal that has zero transmit clock jitter and zero Inter-Symbol Interference (ISI). These ideal symbol boundary points are the endpoints of the "1 UI" in FIGS. 7 and 8.

Another characteristic of a 3-Phase waveform is that there can be multiple zero-crossings (and multiple receiver output transitions) at each UI boundary due to slight differences in rise and fall time between the three signals of the trio, and due to slight differences in signal propagation times between the combinations of signal pairs received (e.g. A-B, B-C, and C-A). This concept is illustrated in FIG. 9 (comprising FIGS. 9A, 9B, and 9C), which shows all possible transitions from the +x wire state for a 3-Phase signal. Moreover, the signal in FIG. 9 has no phase jitter or ISI to illustrate the concept that transitions can occur at slightly different times near each UI boundary due to the noted characteristics of the 3-Phase waveform.

One or more of the differential receiver outputs in the slave will change at each UI boundary due to the symbol encoding rules. When multiple receiver outputs change, they are often staggered in time due to slight differences in rise and fall times between the three signals of the lane and due to slight differences in the length of each of the three signals in a lane. This concept is illustrated in detail in FIG. 9, which shows the five types of transitions that can appear in the eye pattern. FIG. 9 also illustrates how transitions of all three pair combinations can occur at slightly different times near each UI boundary due to the noted characteristics of the physical (C-PHY) layer drivers and receivers; and that there can be one, two or three zero-crossings at each UI boundary. Time $t_{\Delta J}$ in FIG. 9 highlights the time difference of the zero-crossings between the first and last signal pair transition.

A first diagram 902 illustrates a triple transition from state +x to state −x.

A second diagram 904 illustrates a double transition from state +x to state +y.

A third diagram 906 illustrates a single transition from state +x to state −y.

A fourth diagram 908 illustrates a double transition from state +x to state +z.

A fifth diagram 910 illustrates a single transition from state +x to state −z.

3-Phase State Transitions

FIG. 10 shows the state transitions 1000 between the six possible wire states that can be driven by 3-Phase transmitter. At least two of the three wires change at every symbol boundary, wherein no states in the diagram loop back to themselves. In 3-Phase transmitters, symbols are encoded into wire states as defined in Table 1 below. The symbol input value is defined as a 3-bit vector, where the bits are defined as: flip, rotation and polarity. The polarity bit indicates whether or not to change the polarity of the signal from the previous state. The rotation bit defines whether to rotate clockwise (CW) or counterclockwise (CCW). And the flip defines whether the present state is inverted to the opposite polarity without performing a rotation. As previously discussed, the symbols to be transmitted are generated using a mapping function that receives a 16-bit word and converts it to a 7-symbol group.

FIG. 11 illustrates an exemplary end-to-end transmission of data comprising a 16-bit word conversion to channel states. A 3-Phase transmitter 1102 may include a 16 bit interface 1106 which provides 16 bits to a 16-bit-to-7-symbol mapper 1108 (each symbol defined by 3 bits, where 3 bits define one of 5 state transitions). The 21 bits making up the 7 symbols are provided to a parallel-to-serial converter 1110 which serializes the symbols. A symbol encoder 1112 then transmits each symbol over 3 wires (A, B, C) according to 3-phase encoding. At a receiver 1104, a receiver 1114 obtains the 3-phase signals over three wires (A, B, C) and provides each symbol to a serial-to-parallel converter 1116 which then outputs 7 symbols in parallel as 21 bits. The 21 parallel bits are then sent to a 7-symbol-to-16-bit demapper 1118 which outputs a 16-bit word to the output interface 1120.

FIG. 11 also illustrates how the individual mapping/demapping and encoding/decoding functions fit into the communication system 1100 as a whole. Aspects disclosed herein include choosing particular sequences of symbols to make test patterns that are useful to isolate specific key behaviors that are relevant to a particular test. In some cases, it may be possible to send a particular data word to the input of the mapper 11108 to produce a useful test sequence. However, because the mapper 1108 cannot generate all possible sequences of seven symbols, an aspect disclosed herein is directed towards defining a test pattern generator to replace the output of the mapper while in test mode.

FIG. 12 is a block diagram illustrating a modified version of the transmitter in FIG. 11 adding the ability to insert a programmable test sequence as well as pseudo random binary sequence (PRBS) data in place of the normal transmit data from the application. This modified transmitter 1200 includes a first multiplexer 1204 and a second multiplexer 1206 to select between the 16 bit words 1106 and a test pattern provided by a test pattern generator circuit 1204. The test pattern generator circuit 1204 serves to generate possible combinations of states in 3-Phase encoding.

The test pattern generator circuit 1204 may be configured or adapted to generate a programmable sequence of, for example, 14 symbols that repeats indefinitely, or until an external stimulus from Tx Lane Configuration Registers 1210 ends the test.

TABLE 1

Five possible transitions from previous state to present state

| Symbol Input Value | Previous Wire State | | | | | | What Happens |
|---|---|---|---|---|---|---|---|
| | +x | −x | +y | −y | +z | −z | |
| 000 | +z | −z | +x | −x | +y | −y | Rotate CCW, polarity is Same |
| 001 | −z | +z | −x | +x | −y | +y | Rotate CCW, polarity is Opposite |
| 010 | +y | −y | +z | −z | +x | −x | Rotate CW, polarity is Same |
| 011 | −y | +y | −z | +z | −x | +x | Rotate CW, polarity is Opposite |
| 1xx | −x | +x | −y | +y | −z | +z | Same phase, polarity is Opposite |

Notes:
1. Symbol Input value is: [Tx_Flip[n], Tx_Rotation[n], Tx_Polarity[n]]
2. Values in the table show the Present Wire State, based on the Previous Wire State and Symbol Input Value In one example, a test pattern generator 1212 is a set of fourteen 3-bit registers. This set of registers can be used for different purposes.

In a first exemplary implementation, the test pattern generator 1212 may serve to define a 14-symbol pattern in a Preamble Programmable Sequence, which can appear at the beginning of every data burst transmission (not part of a test mode), if the Preamble Programmable Sequence is enabled. This Preamble Programmable Sequence is optional (it may be sent or not sent) as part of a preamble.

In a second exemplary implementation, the 14-symbol pattern can be a test pattern which is sent as the packet data part of a data burst transmission. In this case the Preamble Programmable Sequence would not be used. The fourteen 3-bit registers define the 14-symbol test pattern which is repeated indefinitely. This is the context of the IDF, to use the test pattern in this manner.

In a second exemplary implementation, the fourteen 3-bit registers can also be used as a repeating sequence of fourteen wire state values instead of fourteen symbols.

In the test pattern generator circuit 1204, a Fixed Preamble, Preamble Programmable Sequence, Sync Words, Post pattern generator 1214 may include or store symbol values for particular control fields in the data burst transmission. For example, some patterns may be constants such as Fixed Preamble (3333333), Sync Words (3444443), Post pattern generator (4444444).

A state machine 1216 may serve to control when to send a test pattern within a data burst transmission (e.g., within a preamble or a data portion of the transmission).

The Tx Lane Configuration Registers 1210 may include a set registers (e.g., 12C registers, SPI registers, etc.) to write to a block of registers that chooses the test pattern values and the debug and/or operating modes of the modified transmitter 1200.

A PRBS Generator 1218 may serve to generate a pseudo-random test sequence for a higher level test mode that also uses the mapper 1108 and/or encoder 1112.

Solutions to the 3-Phase Signal Test and Measurement Challenges

By using specially designed test patterns, it is possible to mitigate some of the challenges that complicate the measurement of 3-Phase waveform parameters such as: high-speed weak and strong signal levels, transmit period (transmit clock) jitter, and transmit signal rise and fall time. Some techniques that can be used are described below.

In an aspect of the disclosure, measurement of transmit clock jitter can be simplified by transmitting a repetitive waveform that produces an oscillating sequence of states that is confined to use a single pair of outputs. FIG. 13, for example, illustrates a state diagram comprising state transition loops that have this property. The diagram shows these loops as originating from the +x state, but similar loops can actually exist between any combination of analogous state transitions. For instance, FIG. 13 illustrates two particular state transition loops (i.e., a first state transition 1302 between the +x state and the −y state, and a second state transition 1304 between the +x state and the −z state) that have opposite polarity and simultaneously alternate between CW and CCW rotation. FIG. 13 also illustrates a third state transition 1306 which is caused when states have opposite polarity and no rotation (i.e., the loop between the +x state and the −x state, which corresponds to the exemplary waveform illustrated in FIG. 15).

Examples of time-domain waveforms are shown in FIGS. 14-15 that are the result of traversing through the state loops described FIG. 13. In an aspect, a pattern may be defined to include 14 symbols in length, which will then repeat after that. An exemplary repeating 14-symbol test pattern 1602 is shown in FIG. 16. To this end, it should be noted that the pattern encoded in the waveform in FIG. 14 (i.e., "313131 . . . ") repeats after two symbols, which divides evenly into a 14 symbol pattern. So, a 14-symbol pattern "31313131313131" can be repeated indefinitely as one of the following: +x, −y . . . , or −x, +y . . . , or +y, −z . . . , or −y, +z . . . , or +z, −x . . . , or −z, +x . . . (wherein the pattern "13131313131313" loops in the same manner). The pattern in FIG. 15, however, repeats after two symbols, so it will repeat as any of the following: +x, −x . . . or +y, −y . . . or +z, −z.

In an aspect of the disclosure, the waveforms illustrated in FIGS. 14-15 are useful for measuring the phase jitter of the transmitter clock because they contain a periodic waveform on a single wire pair. This way, there is no additional phase error introduced by having the waveform produced as a result of switching multiple complex combinations of transmitter outputs, and the edges represent the transitions of the internal high-speed symbol clock.

The waveform of FIG. 14, for example, has only the A-B pair that toggles through the zero-crossing. In this example it is the A-B pair that crosses through the differential zero level because of the initial wire state on the trio of signals at the time the "313131 . . . " pattern was started. If the starting state is the +x state then the C-A pair will have zero-crossings and the A-B and B-C pairs will not. Similarly, if the starting state is +y (as in the first example) but the pattern is "131313 . . . ", then the C-A pair will have zero-crossings.

The waveform of FIG. 15, on the other hand, has all three pairs with transitions through the differential zero-crossing level. Although the larger amplitude is on the A-B pair, the B-C and C-A pairs also have a signal that passes through the zero-crossing between the weak one and weak zero levels. For some applications, however, the FIG. 15 waveform may be desirable since clock jitter measurements can be performed using any two of the three signals.

It is contemplated that measurements can be taken by coupling a measurement device to the transmitter. In FIG. 17, for example, a measurement device 1704 is illustrated which can be connected to a transmitter 1702 using either two or three connections, depending upon the specific pattern chosen for the measurement. In an aspect of the disclosure, waveforms such as those in FIGS. 14-15 can be generated by the device being tested (i.e., the transmitter) so that the measurement device (i.e., a digital oscilloscope or analyzer) can measure the transmit symbol clock jitter. This method for connecting a measurement device to a transmitter can also be used to make other measurements described herein.

Signal level measurements are also contemplated. To perform such measurements, a waveform that systematically steps through all four levels can be used. As illustrated in FIG. 18, such a waveform may resemble a staircase pattern, and may be produced via a continuous stream of the symbol value of "333333 . . . ". This pattern of wire states repeats after six symbols, but since the symbol values are a continuous string of "3", it is not important that the pattern length divide evenly into the 14 symbol test pattern (because the symbol pattern length is one). The pattern on the lane will repeat indefinitely as +x, −y, +z, −x, +y, −z . . . and is not dependent on the initial state because all six wire states appear in this sequence. For some applications, this pattern may be desirable for signal level measurement on all of the signals of the lane because every signal steps through all three levels at the transmitter and all four possible differential levels can be observed at each of the three differential receivers at the receiving end, which can be observed in the waveforms of FIG. 18.

In another aspect of the disclosure, patterns to facilitate rise and fall time measurements are also contemplated. Namely, it is contemplated that rise and fall times can be measured manually with an oscilloscope using a combination of waveforms that have a variety of the different transitions:
  STRONG 1 to: WEAK 0, STRONG 0
  WEAK 1 to: WEAK 0, STRONG 0
  WEAK 0 to: STRONG 1, WEAK 1
  STRONG 0 to: WEAK 1, STRONG 1

Here, it should be noted that the waveforms of FIGS. 14, 15, and 18 may be used for measuring rise and fall times since they have these combinations of transitions on the A-B, B-C and C-A signal pairs. An automated rise and fall time measurement system could also be used if a suitable waveform is presented to the measurement system. The measurement system could automatically detect the type of transition, such as those listed above between all strong and weak levels. Pseudorandom data might be used for this type of measurement, but there would be a varied number of the different transitions over time. A very short sequence that has all possible transitions as defined in the state diagram would produce a more deterministic result. An example of such a sequence is illustrated in FIG. 19.

FIG. 19 illustrates a first exemplary 14-symbol sequence that facilitates rise and fall time measurements in accordance with an aspect of the disclosure. The 14-symbol sequence "44224422443110" described in the table 1902 shown in FIG. 19 causes all 30 possible state transitions, and will produce a repetitive wire state sequence after 6 cycles of the 14-symbol sequence, so after 84 unit intervals the sequence will repeat. If it is assumed that the starting wire state is "+x", then the first group of 14 wire states that are transmitted are listed in the row labeled "Cycle 1" 1904. The next group of 14 wire states is produced using the same 14-symbol sequence but the ending state of Cycle 1 1904 is "−z", so Cycle 2 1906 begins from the wire state "−z". The state diagrams in FIGS. 20-25 highlight the wire state transitions that occur in each cycle 1904, 1906, 1908, 1910, 1912, and 1914 for the symbol pattern 1916 described in FIG. 19. For each cycle through the pattern, the starting state is outlined in green and the ending state is outlined in red. The ending state of cycle N is the starting state of cycle N+1. The ending state of Cycle 6 1912 is +x, which is the same as the starting state of Cycle 1 where the sequence repeats.

FIG. 26 illustrates a second exemplary 14-symbol sequence that facilitates rise and fall time measurements in accordance with an aspect of the disclosure. The 14-symbol sequence "42220002333111", described in the table 2602 shown in FIG. 26 causes all 30 possible state transitions, and will produce a repetitive wire state sequence after 6 cycles of the 14-symbol sequence, so after 84 unit intervals the sequence will repeat. State diagrams highlighting the transitions that occur on each cycle 2604, 2606, 2608, 2610, 2612, and 2614 of the symbol pattern 2616 are shown in FIGS. 27-32.

In yet another aspect of the disclosure, patterns to facilitate strong-to-weak rise and fall time measurements are also contemplated. Here, it is noted that the slowest rise and fall time that has maximum impact on the timing budget is the strong-to-weak transition, specifically: strong 0 to weak 1 transition, and strong 1 to weak 0 transition. Examples of this type of transition can be observed FIG. 9: the +x to +y and the +x to +z transitions. The dashed orange waveforms are the strong 0 to weak 1 and strong 1 to weak 0 transitions. These transitions are produced by a symbol having a clockwise or counterclockwise rotation and the polarity change equal to zero. The symbol values that cause these transitions are 0 and 2.

It is contemplated that a pattern can be created that traverses through all possible strong-to-weak transitions in 14 unit intervals.

FIG. 33 is a state diagram illustrating strong to weak transition states for an exemplary test pattern in accordance with an aspect of the disclosure. The exemplary pattern may be, for instance, the symbol pattern "22200042220004". In FIG. 33, a state diagram is provided that has all possible 0 and 2 symbol transitions highlighted, wherein the state transitions will follow this highlighted path when the "22200042220004" pattern is transmitted. The example assumes that the starting state is the +x state. If the starting state is different than +x then all of the same strong to weak transitions will occur, but only the "Flip" transition between the inner and outer (positive and negative) states will be different. The specific flip transition that occurs is not of consequence to the strong-to-weak transitions that occur in this pattern, because all possible strong-to-weak transitions will occur in a 14 unit interval cycle when the starting state is any of the six possible starting states.

When the "22200042220004" pattern begins from the +x state, then the following sequence of wire states are traversed, and then the pattern repeats: +x, +y, +z, +x, +z, +y, +x, −x, −y, −z, −x, −z, −y, −x . . . . After the −x state at the end of the wire-state sequence, the "4" symbol at the end of the symbol sequence causes a "Flip" transition to the +x state and the pattern repeats.

FIG. 34 is a waveform illustrating exemplary strong to weak transitions for the state diagram of FIG. 33. FIG. 34 illustrates the 14 unit interval waveform for the symbol pattern "22200042220004". Both the transmitted waveform ($V_A$, $V_B$, $V_C$) (sent by transmitter) and the three differential waveforms (obtained at receiver) are shown ($V_A$-$V_B$, $V_B$-$V_C$, $V_C$-$V_A$). Two rows 3402 and 3404 are shown with approximately half the 14 unit interval pattern displayed in each row; the −x wire state at the end of the first row 3402 is partially duplicated at the beginning of the second row 3404. Similarly, the +x state at the end of the second row 3404 is partially duplicated at the beginning of the first row 3402.

It is also possible to compare the delay between the three driver outputs, to measure intra-trio skew using these types of patterns. Patterns having nearly identical state transitions in consecutive unit intervals such as those shown in FIGS. 18 and 34 can be displayed in an overlapped fashion, similar to a conventional eye pattern, or waveforms can be displayed overlapped with multiple cycles in the display. The purpose is that the same symbol transition is compared by producing the same effect from different starting states. The impact of transmit symbol clock jitter should be removed to increase the effectiveness of this comparison method. For instance, a waveform having a symbol value of 2 can cause +x to +y, +y to +z, +z to +x, −x to −y, −y to −z, −z to −x. A waveform having all of these transitions can be overlapped to observe the time difference or skew from each of these transitions.

FIG. 35 is a block diagram illustrating an exemplary hardware implementation of a transmitting device 3500 in accordance with the aspects disclosed herein is provided. It should be noted that transmitting device 3500 may perform one or more functions and/or features described in any one or more of FIGS. 1-34. In accordance with various aspects of the disclosure, an element, or any portion of an element, or any combination of elements may be implemented with a transmitting device 3500 that includes a processing circuit 3504. Examples of the processing circuit 3504 may include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. That is, the processing circuit 3504, as utilized in transmitting device 3500, may be used to implement any one or more of the processes disclosed herein.

In this example, the transmitting device 3500 may be implemented with a bus architecture, represented generally by a bus 3502. The bus 3502 may include any number of interconnecting buses and bridges depending on the specific application of the transmitting device 3500 and the overall design constraints. The bus 3502 links together various circuits including one or more processors (represented generally by the processor 3504), a memory 3505, and computer-readable media (represented generally by the computer-readable medium 3506). The bus 3502 may also link various other circuits such as timing sources, peripherals, voltage regulators, and power management circuits, which are well known in the art, and therefore, will not be described any further.

In an aspect of the disclosure, computer-readable medium 3506 is configured to include various instructions 3506a, 3506b, and/or 3506c to facilitate utilizing test patterns for electrical testing of multi-wire signals, as disclosed herein. In a similar aspect, utilization of such test patterns can instead be implemented via hardware by coupling processor 3504 to any of circuits 3520, 3530, and/or 3540, as shown. Moreover, it is contemplated that the utilization of test patterns may be performed by any combination of instructions 3506a, 3506b, and/or 3506c, as well as any combination of circuits 3520, 3530, and/or 3540.

For instance, in this particular example, selection instructions 3506a and/or selection circuit 3520 are directed towards selecting a measurement task associated with a transmission of an encoded signal transmitted via a plurality of data lines. As stated previously, any of various measurement tasks are contemplated including, but not limited to, a transmit clock jitter measurement, a signal level measurement, or a rise and fall time measurement.

In another aspect of the disclosure, transmitting device 3500 may be configured to generate a repeating waveform corresponding to the selected measurement task via generator instructions 3506b and/or generator circuit 3530. For instance, if a transmit clock jitter measurement is desired, instructions 3506b and/or circuit 3530 may be configured to generate a repeating periodic waveform on a single wire pair of the plurality of data lines (See e.g., FIGS. 15-16). If a signal level measurement is desired, however, generator instructions 3506b and/or generator circuit 3530 may be configured to generate a repeating staircase waveform on each of the plurality of data lines (See e.g., FIG. 18). If a rise and fall time measurement is desired, generator instructions 3506b and/or generator circuit 3530 may be configured to generate a repeating waveform that causes all possible state transitions associated with the plurality of lines to occur (See e.g., FIGS. 19-20).

It should also be appreciated that existing registers in conventional transmitting devices may be utilized to generate the test patterns disclosed herein. For instance, either of generator instructions 3506b or generator circuit 3530 may comprise a programmable pattern generator subcomponent configured to load the desired patterns onto such registers. Namely, generator instructions 3506b and/or generator circuit 3530 may be configured to generate any of a plurality of repeating waveforms via a programmable pattern generator, wherein each of the plurality of repeating waveforms are respectively associated with a corresponding measurement task. To this end, it should be appreciated that the programmable pattern generator can be programmed to generate waveforms according instructions provided either internally (e.g., from memory 3505 or generator instructions 3506b) or externally (e.g., from a receiving device 3700 or testing equipment).

In yet another aspect of the disclosure, once the desired pattern has been generated, transmitting device 3500 may utilize transmitter instructions 3506c and/or transmitter circuit 3540 to transmit the repeating waveform corresponding to the selected measurement task to the receiving device 3700 via the plurality of data lines. Here, although FIG. 35 only illustrates three data lines connecting the transmitting device 3500 to the receiving device 3700, it should be appreciated that the concepts disclosed herein can similarly be implemented to test an N-Phase or an N-Factorial transmitter.

Referring back to the remaining elements of FIG. 35, it should be appreciated that processing circuit 3504 is responsible for managing the bus 3502 and general processing, including the execution of software stored on the computer-readable medium 3506. The software, when executed by the processing circuit 3504, causes the transmitting device 3500 to perform the various functions described below for any particular apparatus. The computer-readable medium 3506 may also be used for storing data that is manipulated by the processing circuit 3504 when executing software.

The processing circuit 3504 may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 3506. The computer-readable medium 3506 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 3506 may reside in the transmitting device 3500, external to the transmitting device 3500, or distributed across multiple entities including the transmitting device 3500. The computer-readable medium 3506 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

FIG. 36 is a flow chart illustrating an exemplary method for implementing one or more aspects disclosed herein from a transmitter device. As illustrated, method may include a series of acts that may be performed within a transmitting device (e.g., transmitting device 3500). For instance, method may be implemented by employing a processing circuit to execute computer executable instructions stored on a computer readable storage medium to implement the series of acts. In another embodiment, a computer-readable storage medium comprising code for causing at least one computer to implement the acts is contemplated.

As illustrated, a measurement task is selected 3602. As stated previously, any of various measurement tasks are contemplated including, but not limited to, a transmit clock jitter measurement, a signal level measurement, or a rise and fall time measurement. Once the desired measurement task is selected, a repeating waveform is generated 3604 corresponding to the measurement task. The repeating waveform is then transmitted 3606 to a receiving (e.g., measurement/test) device via a plurality of data lines.

FIG. 37 is a block diagram illustrating an exemplary hardware implementation of a receiving (measurement/test) device according to some aspects described herein. In one example, the receiving device 3700 may be part of a test equipment. Here, it should be appreciated that the receiving device 3700 may include various components (e.g., processor 3704, memory 3705, and computer-readable storage medium 3706) that are generally analogous to corresponding components illustrated in FIG. 35 for the transmitting device 3500 (e.g., processor 3504, memory 3505, and computer-readable storage medium 3506). The receiving device 3700, however, may also comprises various components which do not have counterparts in FIG. 35, which will be discussed below.

In an aspect of the disclosure, a computer-readable medium 3706 is configured to include various instructions 3706a, 3706b, and/or 3706c to facilitate measuring electrical parameters of multi-wire signals via analysis of particular test pattern outputs, as disclosed herein. In a similar aspect, such measurements can instead be implemented via hardware by coupling a processing circuit 3704 to one or more circuits 3720, 3730, and/or 3740, as shown. Moreover, it is contemplated that the electrical parameter measurements may be performed by any combination of instructions 3706a, 3706b, and/or 3706c, as well as any combination of the one or more circuits 3720, 3730, and/or 3740.

As illustrated, the receiving device 3700 may be coupled to a transmitting device 3500 via a plurality of data lines connected to receiving circuit 3720. In this particular example, receiving instructions 3706a and the receiving circuit 3720 are directed towards facilitating receiving a signal via the plurality of data lines, wherein the received signal corresponds to a particular measurement task and comprises a repeating waveform on at least one of the plurality of data lines. As stated previously, any of various measurement tasks are contemplated including, but not limited to, a transmit clock jitter measurement, a signal level measurement, or a rise and fall time measurement. Here, although only three data lines are shown, it should again be appreciated that the concepts disclosed herein can similarly be implemented to test an N-Phase or an N-Factorial transmitter.

In another aspect of the disclosure, the receiving device 3700 may be configured to ascertain at least one differential between a pair of the plurality of data lines from the signal via differential instructions 3706b or the differential circuit 3730. The receiving device 3700 may also be configured to then determine a measurement associated with the measurement task based on the at least one differential via measuring instructions 3706c or measuring circuit 3740. For instance, if a transmit clock jitter measurement is desired, the received signal may comprise a repeating periodic waveform on a single wire pair of the plurality of data lines (See e.g., FIGS. 15-16). If a signal level measurement is desired, however, the received signal may comprise a repeating staircase waveform on each of the plurality of data lines (See e.g., FIG. 18). If a rise and fall time measurement is desired, the received signal may comprise a repeating waveform that causes all possible state transitions associated with the plurality of lines to occur (See e.g., FIGS. 19-20).

FIG. 38 is a flow chart illustrating an exemplary method for implementing one or more aspects disclosed herein within a receiving (measurement/test) device. As illustrated, the method may include a series of acts that may be performed within the measurement device (e.g., receiver device 3700) according to one or more aspects described herein. For instance, the method may be implemented by employing a processing circuit to execute computer executable instructions stored on a computer readable storage medium to implement the series of acts. In another embodiment, a computer-readable storage medium comprising code for causing at least one computer to implement the acts of process 3800 is contemplated.

As illustrated, a test signal comprising a repeating waveform may be received 3802 via a plurality of data lines 3802. The repeating waveform may correspond to a particular measurement task. As stated previously, any of various measurement tasks are contemplated including, but not limited to, a transmit clock jitter measurement, a signal level measurement, or a rise and fall time measurement. Upon receiving the signal, at least one differential measurement may be ascertained 3804 between a pair of the plurality of data lines. An electrical parameter may be obtained or measured 3806 based on the at least one differential measurement.

FIG. 39 illustrates an exemplary method operational in a transmitting device to facilitate measurement tasks over a plurality of lines. A measurement task is selected, the measurement task associated with a transmission of an encoded signal transmitted via a plurality of data lines, wherein the encoded signal is encoded using one or more of 3-Phase, N-Phase, or N-factorial low-voltage differential signaling (LVDS) where N is at least three (3) 3902. A repeating waveform may be generated corresponding to the measurement task 3904. The repeating waveform corresponding to the measurement task may be transmitted via the plurality of data lines 3906.

In a first example, the measurement task may be a transmit clock jitter measurement, and generating the repeating waveform includes repeating a periodic waveform on a single wire pair of the plurality of data lines.

In a second example, the measurement task may be a transmit clock jitter measurement, and generating the repeating waveform includes repeating a periodic waveform on a plurality of wire pairs of the plurality of data lines.

In a third example, the measurement task is a signal level measurement, and generating the repeating waveform includes repeating a staircase waveform on each of the plurality of data lines.

In a fourth example, the measurement task is a rise and fall time measurement, and generating the repeating waveform includes repeating a waveform that causes all possible state transitions associated with the plurality of lines to occur. In one implementation, the repeating waveform may be generated to have a pattern that traces all possible state transitions of the encoded signal. The encoded signal may have thirty possible state transitions and the repeating waveform of fourteen symbols may be generated to have a pattern that traces all thirty possible state transitions.

In yet another example, generating the repeating waveform may include generating any of a plurality of repeating waveforms via a programmable pattern generator, each of the plurality of repeating waveforms respectively associated with a corresponding measurement task.

In one implementation of the transmitting device, an encoder encodes the signals and the repeating waveform is generated to have a pattern that beats with a state of the encoder to produce a longer repeating pattern of states on the plurality of data lines than would be produced without such beating. For example, the encoder takes in a 3-bit symbol value that defines one of five possible symbol states. The encoder uses this Tx symbol value and the previous wire state (one of six possible wire state values) that was transmitted on the channel to determine the next wire state value to transmit. Because the encoder contains a state value (the previously transmitted wire state), it can potentially loop through a sequence of wire states, depending upon the input symbol values.

There are some symbol sequences that produce a very short sequence of wire states, and other symbol sequences that produce a very long repeating sequence of wire states. For example: a symbol sequence of 131313 . . . will cause the encoder to oscillate between only two wire state values. This causes the output to oscillate in a loop of only two states.

Another example of an opposite situation is a sequence of fourteen symbols to be transmitted that align with the encoder state in such a manner that the transmitted wire state pattern repeats every 14×6=84 wire states. This happens because the state of the encoder produces a different wire state at the end of a particular sequence of fourteen symbols. The last wire state transmitted when transmitting the fourteenth symbol is a different one of the six possible wire states, so after six repetitions of transmitting the fourteen symbol pattern, the encoder state and the starting symbol value align as they did in the beginning. So, in this way, the repeating loop of fourteen symbols beats with six starting (or ending) states of the encoder to produce a sequence of wire states which is the product of the sequence length of the symbol pattern (14) and the ending encoder state (a loop of 6) that exists when sending that sequence of symbols.

In various embodiments, the repeating waveform may be generated to have: (a) a staircase pattern, (b) a pattern that limits a number of zero-voltage crossings of signals on the data lines, or (c) a pattern that limits zero-voltage crossings of signals on the data lines to transitions between a pair of data lines of the plurality of data lines.

Likewise, a device may be configured to perform the functions described in relation to FIG. 39. For example, a selection circuit may be configured to select a measurement task associated with a transmission of an encoded signal transmitted via a plurality of data lines, wherein the encoded signal is encoded using one or more of 3-Phase, N-Phase, or N-factorial low-voltage differential signaling (LVDS) where N is at least three (3). A generator circuit may be configured to generate a repeating waveform corresponding to the measurement task. A transmitter circuit may be configured to transmit the repeating waveform corresponding to the measurement task via the plurality of data lines.

FIG. 40 illustrates an exemplary method operational in a receiving device to facilitate measurement tasks over a plurality of lines. In one example, the receiving device may be a measuring device or a test device.

A signal may be received via a plurality of data lines, the signal corresponding to a measurement task associated with an encoded signal and comprising a repeating waveform on at least one of the plurality of data lines, wherein the encoded signal uses one or more of 3-Phase, N-Phase, or N-factorial low-voltage differential signaling (LVDS) where N is at least three (3) 4002. At least one differential (e.g., difference in a characteristic between two lines) may be ascertained from the signal, the at least one differential corresponding to a differential between a pair of the plurality of data lines 4004. A measurement associated with the measurement task may then be determined based on the at least one differential 4006.

In a first example, the measurement task may be a transmit clock jitter measurement, and wherein receiving the signal includes receiving a repeating periodic waveform on a single wire pair of the plurality of data lines.

In a first example, the measurement task may be a transmit clock jitter measurement, and receiving the signal includes receiving a repeating periodic waveform on a plurality of wire pairs of the plurality of data lines.

In a third example, the measurement task may be a signal level measurement, and wherein the receiving comprises receiving a repeating staircase waveform on each of the plurality of data lines.

In a fourth example, the measurement task may be a rise and fall time measurement, and receiving the signal includes receiving a repeating waveform in which all possible state transitions associated with the plurality of lines occur.

In one implementation, the repeating waveform may have a pattern that traces all possible state transitions of the encoded signal.

The encoded signal may have thirty possible state transitions and the repeating waveform of fourteen symbols has a pattern that traces all thirty possible state transitions.

In various examples, the repeating waveform may have: (a) a staircase pattern, (b) a pattern that limits a number of zero-voltage crossings of signals on the data lines, or (c) a pattern that limits zero-voltage crossings of signals on the data lines to transitions between a pair of data lines of the plurality of data lines.

Likewise, a device may be configured to perform the functions described in relation to FIG. 40. For example, a receiving circuit may be configured to receive a signal via a plurality of data lines, the signal corresponding to a measurement task associated with an encoded signal and comprising a repeating waveform on at least one of the plurality of data lines, wherein the encoded signal uses one or more of 3-Phase, N-Phase, or N-factorial low-voltage differential signaling (LVDS) where N is at least three (3). A differential circuit may be configured to ascertain at least one differential from the signal, the at least one differential corresponding to a differential between a pair of the plurality of data lines. A measurement circuit may be configured to determine a measurement associated with the measurement task, the measurement based on the at least one differential.

One or more of the components, steps, features, and/or functions illustrated in the Figures may be rearranged and/or combined into a single component, step, feature, or function or embodied in several components, steps, or functions. Additional elements, components, steps, and/or functions may also be added without departing from novel features disclosed herein. The apparatus, devices, and/or components illustrated in the Figures may be configured to perform one or more of the methods, features, or steps described in the Figures. The novel algorithms described herein may also be efficiently implemented in software and/or embedded in hardware.

In addition, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices, and/or other machine readable mediums for storing information. The term "machine readable medium" includes, but is not limited to portable or fixed storage devices, optical storage devices, wireless channels and various other mediums capable of storing, containing, or carrying instruction(s) and/or data.

Furthermore, embodiments may be implemented by hardware, software, firmware, middleware, microcode, or any combination thereof. When implemented in software, firmware, middleware, or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A method, comprising:
   selecting a measurement task associated with a transmission of an encoded signal transmitted via a plurality of data lines, wherein the encoded signal is encoded using one or more of 3-Phase, N-Phase, or N-factorial low-voltage differential signaling (LVDS) where N is at least three (3);
   generating a repeating waveform corresponding to the selected measurement task; and
   transmitting the repeating waveform corresponding to the measurement task via the plurality of data lines, wherein the repeating waveform is used to perform an electrical parameter measurement associated with the selected measurement task.

2. The method of claim 1, wherein the measurement task is a transmit clock jitter measurement, and generating the repeating waveform includes repeating a periodic waveform on a single wire pair of the plurality of data lines.

3. The method of claim 1, wherein the measurement task is a transmit clock jitter measurement, and generating the repeating waveform includes repeating a periodic waveform on a plurality of wire pairs of the plurality of data lines.

4. The method of claim 1, wherein the measurement task is a signal level measurement, and generating the repeating waveform includes repeating a staircase waveform on each of the plurality of data lines.

5. The method of claim 1, wherein the measurement task is a rise and fall time measurement, and generating the repeating waveform includes repeating a waveform that causes all possible state transitions associated with the plurality of lines to occur.

6. The method of claim 1, wherein generating the repeating waveform includes generating a plurality of repeating waveforms via a programmable pattern generator, each of the plurality of repeating waveforms respectively associated with a corresponding measurement task.

7. The method of claim 1, wherein an encoder encodes the signals and wherein the repeating waveform is generated to have a pattern that beats with a state of the encoder to produce a longer repeating pattern of states on the plurality of data lines than would be produced without such beating.

8. The method of claim 1, wherein the repeating waveform is generated to have a pattern that traces all possible state transitions of the encoded signal.

9. The method of claim 8, wherein the encoded signal has thirty possible state transitions and the repeating waveform of fourteen symbols is generated to have a pattern that traces all thirty possible state transitions.

10. The method of claim 1, wherein the repeating waveform is generated to have a staircase pattern.

11. The method of claim 1, wherein the repeating waveform is generated to have a pattern that limits a number of zero-voltage crossings of signals on the data lines.

12. The method of claim 11, wherein the repeating waveform is generated to have a pattern that limits zero-voltage crossings of signals on the data lines to transitions between a pair of data lines of the plurality of data lines.

13. A device comprising:
    a selection circuit configured to select a measurement task associated with a transmission of an encoded signal transmitted via a plurality of data lines, wherein the encoded signal is encoded using one or more of 3-Phase, N-Phase, or N-factorial low-voltage differential signaling (LVDS) where N is at least three (3);
    a generator circuit configured to generate a repeating waveform corresponding to the selected measurement task;
    a transmitter circuit configured to transmit the repeating waveform corresponding to the measurement task via the plurality of data lines, wherein the transmitter circuit transmits the repeating waveform to a measurement circuit that is configured to perform an electrical parameter measurement associated with the selected measurement task.

14. The device of claim 13, wherein the measurement task is a rise and fall time measurement, and generating the repeating waveform includes repeating a waveform that causes all possible state transitions associated with the plurality of lines to occur.

15. The device of claim 13, wherein the repeating waveform is generated to have a pattern that traces all possible state transitions of the encoded signal.

16. A method, comprising:
    receiving a signal via a plurality of data lines, the signal corresponding to a measurement task associated with an encoded signal and comprising a repeating waveform on at least one of the plurality of data lines, wherein the encoded signal uses one or more of 3-Phase, N-Phase, or N-factorial low-voltage differential signaling (LVDS) where N is at least three (3);
    ascertaining at least one differential from the signal, the at least one differential corresponding to a differential between a pair of the plurality of data lines; and
    determining a measurement associated with the measurement task, the measurement based on the at least one differential.

17. The method of claim 16, wherein the measurement task is a transmit clock jitter measurement, and receiving the signal includes receiving a repeating periodic waveform on a single wire pair of the plurality of data lines.

18. The method of claim 16, wherein the measurement task is a transmit clock jitter measurement, and receiving the signal includes receiving a repeating periodic waveform on a plurality of wire pairs of the plurality of data lines.

19. The method of claim 16, wherein the measurement task is a signal level measurement, and receiving the signal includes receiving a repeating staircase waveform on each of the plurality of data lines.

20. The method of claim 16, wherein the measurement task is a rise and fall time measurement, and receiving the signal includes receiving a repeating waveform in which all possible state transitions associated with the plurality of lines occur.

21. The method of claim 16, wherein the repeating waveform has a pattern that traces all possible state transitions of the encoded signal.

22. The method of claim 21, wherein the encoded signal has thirty possible state transitions and the repeating waveform of fourteen symbols has a pattern that traces all thirty possible state transitions.

23. The method of claim 16, wherein the repeating waveform has a staircase pattern.

24. The method of claim 16, wherein the repeating waveform has a pattern that limits a number of zero-voltage crossings of signals on the data lines.

25. The method of claim 24, wherein the repeating waveform has a pattern that limits zero-voltage crossings of signals on the data lines to transitions between a pair of data lines of the plurality of data lines.

26. A device, comprising:
   a receiving circuit configured to receive a signal via a plurality of data lines, the signal corresponding to a measurement task associated with an encoded signal and comprising a repeating waveform on at least one of the plurality of data lines, wherein the encoded signal uses one or more of 3-Phase, N-Phase, or N-factorial low-voltage differential signaling (LVDS) where N is at least three (3);
   a differential circuit configured to ascertain at least one differential from the signal, the at least one differential corresponding to a differential between a pair of the plurality of data lines; and
   a measurement circuit configured to determine a measurement associated with the measurement task, the measurement based on the at least one differential.

* * * * *